(12) United States Patent
Fujii et al.

(10) Patent No.: US 8,349,535 B2
(45) Date of Patent: Jan. 8, 2013

(54) ACTINIC RAY-SENSITIVE OR RADIATION-SENSITIVE RESIN COMPOSITION AND METHOD OF FORMING PATTERN THEREWITH

(75) Inventors: Kana Fujii, Haibara-gun (JP); Takamitsu Tomiga, Haibara-gun (JP); Toru Tsuchihashi, Haibara-gun (JP); Kazuyoshi Mizutani, Haibara-gun (JP); Jiro Yokoyama, Haibara-gun (JP); Shinichi Sugiyama, Haibara-gun (JP); Shuji Hirano, Haibara-gun (JP); Toru Fujimori, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/895,504

(22) Filed: Sep. 30, 2010

(65) Prior Publication Data

US 2011/0081612 A1    Apr. 7, 2011

Related U.S. Application Data

(63) Continuation of application No. PCT/JP2009/057032, filed on Mar. 31, 2009.

(30) Foreign Application Priority Data

Mar. 31, 2008 (JP) ................. 2008-094251
Dec. 26, 2008 (JP) ................. 2008-331732

(51) Int. Cl.
*G03F 7/039* (2006.01)
*G03F 7/20* (2006.01)
*G03F 7/30* (2006.01)

(52) U.S. Cl. ........... 430/270.1; 430/311; 430/326; 430/905; 430/910; 430/920; 430/921; 430/922; 430/925

(58) Field of Classification Search ............ None
See application file for complete search history.

(56) References Cited

U.S. PATENT DOCUMENTS

| | | | |
|---|---|---|---|
| 5,561,194 A | 10/1996 | Cornett et al. | |
| 5,679,495 A | 10/1997 | Yamachika et al. | |
| 5,994,022 A * | 11/1999 | Tanabe et al. | 430/170 |
| 7,923,196 B2 * | 4/2011 | Tsuchihashi et al. | 430/270.1 |
| 2003/0022097 A1 | 1/2003 | Malik et al. | |
| 2006/0040203 A1 | 2/2006 | Kodama et al. | |
| 2007/0031758 A1 * | 2/2007 | Nishikawa et al. | 430/270.1 |
| 2008/0248419 A1 | 10/2008 | Hirano | |

FOREIGN PATENT DOCUMENTS

| | | |
|---|---|---|
| EP | 1 030 221 A1 | 8/2000 |
| EP | 1 729 176 A1 | 12/2006 |
| EP | 1 975 712 A2 | 10/2008 |
| EP | 2 177 952 A1 | 4/2010 |
| JP | 3116751 B2 | 8/1995 |
| JP | 11-501909 A | 2/1999 |
| JP | 2000-235264 A | 8/2000 |
| JP | 2007-178903 A | 7/2007 |
| JP | 2008-268875 A | 11/2008 |
| WO | 96/27584 A | 9/1996 |
| WO | 2009/022561 A1 | 2/2009 |

* cited by examiner

*Primary Examiner* — Sin J. Lee
(74) *Attorney, Agent, or Firm* — Sughrue Mion, PLLC

(57) ABSTRACT

According to one embodiment, an actinic ray-sensitive or radiation-sensitive resin composition includes (A) a resin containing the repeating units of formulae (I), (II) and (III) that when acted on by an acid, becomes soluble in an alkali developer, and (B) a compound that when irradiated with actinic rays or radiation, generates a fluorine-containing acid,

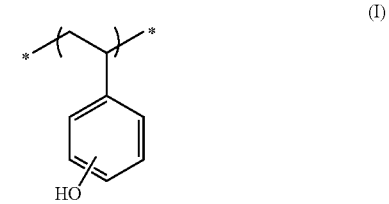

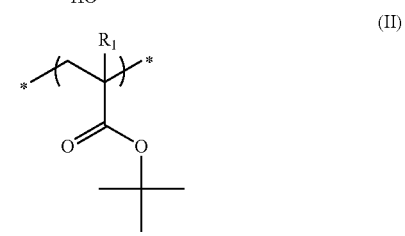

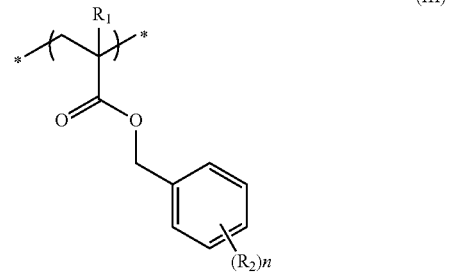

wherein each of $R_1$ independently represents a hydrogen atom or an optionally substituted methyl group, $R_2$ represents a halogen atom, an optionally substituted alkyl group, an optionally substituted cycloalkyl group, an optionally substituted aryl group or an optionally substituted aralkyl group, and n is an integer of 0 to 5, provided that when n is 2 or greater, multiple $R_2$s may be identical to or different from each other.

9 Claims, No Drawings

ACTINIC RAY-SENSITIVE OR RADIATION-SENSITIVE RESIN COMPOSITION AND METHOD OF FORMING PATTERN THEREWITH

CROSS REFERENCE TO RELATED APPLICATIONS

This is a Continuation Application of PCT Application No. PCT/JP2009/057032, filed Mar. 31, 2009, which was published under PCT Article 21(2) in English.

This application is based upon and claims the benefit of priority from prior Japanese Patent Applications No. 2008-094251, filed Mar. 31, 2008; and No. 2008-331732, filed Dec. 26, 2008, the entire contents of both of which are incorporated herein by reference.

BACKGROUND OF THE INVENTION

1. Field of the Invention

The present invention relates to an actinic ray-sensitive or radiation-sensitive resin composition suitable for use in an ultramicrolithography process or other photofabrication process for production of very-large-scale integrated circuits or large-capacity microchips, etc. More particularly, the present invention relates to an actinic ray-sensitive or radiation-sensitive resin composition, especially a positive resist composition, suitable for use in the formation of a highly fined pattern with the use of KrF excimer laser beams, electron beams, EUV rays or the like and relates to a method of forming a pattern with the use of the composition.

In the present invention, the terms "actinic rays" and "radiation" mean, for example, radiation of the mercury lamp brightline spectrum, far ultraviolet represented by excimer laser, X-rays, electron beams or the like. In the present invention, the term "light" means actinic rays or radiation.

2. Description of the Related Art

In the production process for semiconductor devices, such as ICs and LSIs, it is conventional to perform microfabrication by lithography with the use of a photoresist composition. In recent years, the formation of an ultrafine pattern in the submicron region or quarter-micron region is increasingly demanded in accordance with the realization of high integration for integrated circuits. Accordingly, the trend of exposure wavelength toward a short wavelength, for example, from g/i rays to KrF excimer laser beams is seen.

In the lithography using KrF excimer laser beams, it is a critical issue to simultaneously satisfy all the requirements of wide exposure latitude, decrease of line edge roughness, desirable pattern configuration, excellent dry etching resistance and less defects upon development, therefore this issue needs to be resolved.

As a resist suitable for use in the lithography process using KrF excimer laser beams, electron beams or EUV rays, it is predominant to employ a chemical amplification resist utilizing an acid catalyzed reaction from the viewpoint of attainment of high sensitivity. In the field of positive resists, effective use is made of a chemical amplification resist composition composed mainly of an acid generator and a phenolic polymer with properties such that it is insoluble or poorly soluble in an alkali developer but when acted on by an acid, becomes soluble in the alkali developer (hereinafter simply referred to as "phenolic acid-decomposable resin").

With respect to the positive resist, some resist compositions containing a phenolic acid-decomposable resin obtained by copolymerization of an acid-decomposable acrylate monomer are known. As such, there can be mentioned, for example, positive resist compositions disclosed in patent reference (1).

However, the above positive resist compositions have a drawback such that a carboxylic acid is generated at an exposed area so as to cause the dissolution rate in a developer to become extremely high, with the result that upon the actual formation of a resist pattern on a substrate, pattern upper portions become thin to thereby cause the formation of an ideal rectangular pattern to be infeasible. In order to cope with this drawback, for example, patent reference (2) proposes to employ a polymer having a repeating unit, such as methyl methacrylate or styrene, capable of reducing the polymer solubility in an alkali developer.

However, when a polymer having a repeating unit like styrene with extremely high hydrophobicity is used in a positive resist composition, the danger that the solubility in an alkali developer is excessively lowered increases, which thereby increases the probability of defects.

On the other hand, when use is made of a repeating unit like methyl methacrylate with relatively low hydrophobicity, although the development defects are less likely, the plasma etching resistance would be unsatisfactory, which would increase the difficulty of selective etching.

Furthermore, in patent reference (3), a resist composition containing a highly reactive photo-acid generator so as to attain improvement in pattern configuration and image resolution is introduced.

Despite any combination of above-mentioned technologies, it is difficult to attain balanced accomplishment of lithographic performances, and the current situation is that success has not been achieved in simultaneously satisfying of all the requirements of wide exposure latitude, decrease of LWR, desirable pattern configuration, excellent dry etching resistance and less defects upon development.

[Patent reference 1] U.S. Pat. No. 5,561,194

[Patent reference 2] JP 3116751

[Patent reference 3] Published Japanese Translation of PCT Patent Applications from Other States, 11-501909

BRIEF SUMMARY OF THE INVENTION

Problem to be Solved by the Invention

It is an object of the present invention to solve the problem of performance enhancing technology in the microfabrication of semiconductor elements using actinic rays or radiation, especially KrF excimer laser beams, electron beams or EUV rays. More specifically, it is an object of the present invention to provide an actinic ray-sensitive or radiation-sensitive resin composition capable of not only satisfying the requirements of wide exposure latitude, decrease of LWR, desirable pattern configuration and excellent dry etching resistance but also producing a pattern being lower in defects upon development and to provide a method of forming a pattern with the use of such composition.

Means for Solving the Problem

As a result of the inventors' extensive and intensive studies, the object of the present invention has been attained by the following.

(1) An actinic ray-sensitive or radiation-sensitive resin composition comprising:

(A) a resin containing the repeating units of formulae (I), (II) and (III) that when acted on by an acid, becomes soluble in an alkali developer, and (B) a compound that when irradiated with actinic rays or radiation, generates a fluorine-containing acid.

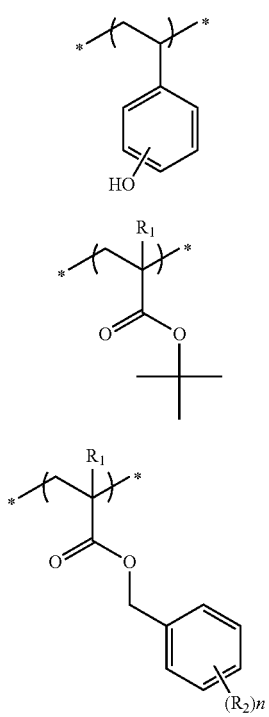

In the formula (II), $R_1$ represents a hydrogen atom or an optionally substituted methyl group.

In the formula (III), $R_1$ represents a hydrogen atom or an optionally substituted methyl group, $R_2$ represents a halogen atom, an optionally substituted alkyl group, an optionally substituted cycloalkyl group, an optionally substituted aryl group or an optionally substituted aralkyl group, and n is an integer of 0 to 5, provided that when n is 2 or greater, multiple $R_2$s may be identical to or different from each other.

(2) The actinic ray-sensitive or radiation-sensitive resin composition according to item (1), characterized in that the resin as component (A) contains at least either the structure of formula (I-a) or the structure of formula (I-b) as the repeating unit of formula (I).

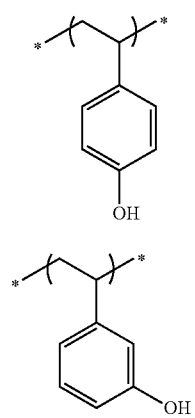

(3) The actinic ray-sensitive or radiation-sensitive resin composition according to item (1), characterized in that the resin as component (A) contains the structure of formula (I-a) and the structure of formula (I-b) as the repeating unit of formula (I).

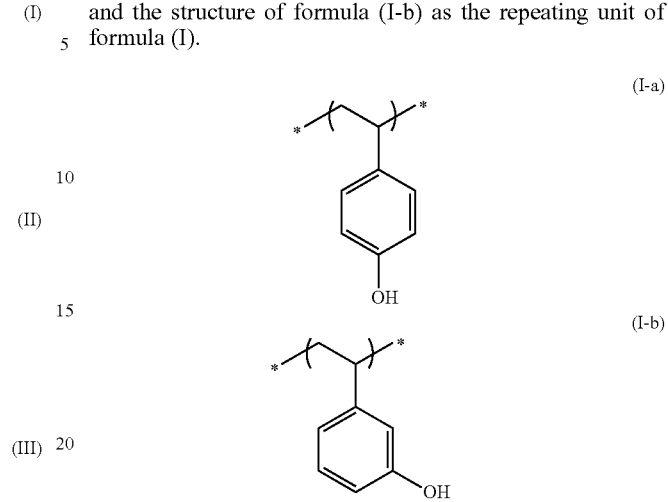

(4) The actinic ray-sensitive or radiation-sensitive resin composition according to any of items (1) to (3), characterized in that the resin as component (A) has a mass average molecular weight of 15,000 to 25,000.

(5) The actinic ray-sensitive or radiation-sensitive resin composition according to any of items (1) to (4), characterized in that the content ratios of repeating units of formulae (I) to (III) based on all the repeating units contained in the resin as component (A) are in the range of 55 to 75 mol %, 15 to 35 mol % and 5 to 20 mol %, respectively.

(6) The actinic ray-sensitive or radiation-sensitive resin composition according to any of items (1) to (5), comprising no resin other than resins as component (A) which contains the repeating units of formulae (I), (II) and (III).

(7) The actinic ray-sensitive or radiation-sensitive resin composition according to any of items (1) to (6), wherein the content of resin as component (A) in the composition is in the range of 95.5 to 97.0 mass % based on the total solids of the composition.

(8) The actinic ray-sensitive or radiation-sensitive resin composition according to any of items (1) to (7), wherein the resin as component (A) consists only of the repeating units of formulae (I), (II) and (III).

(9) The actinic ray-sensitive or radiation-sensitive resin composition according to any of items (1) to (8), wherein the content of total solids of the composition is in the range of 2 to 30 mass %.

(10) The actinic ray-sensitive or radiation-sensitive resin composition according to any of items (1) to (9), characterized in that at least one member selected from among the compounds of formulae (B-a) and (B-b) is contained as the acid generator constituting the component (B).

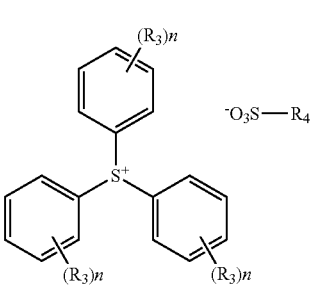

In the formula, each of $R_3$s independently represents a hydrogen atom, an optionally substituted alkyl group, an optionally substituted aryl group, an optionally substituted alkoxy group or an optionally substituted cycloalkyl group.

$R_4$ represents a phenyl group substituted with at least a fluorine atom and/or a fluoroalkyl group.

n is an integer of 0 to 5.

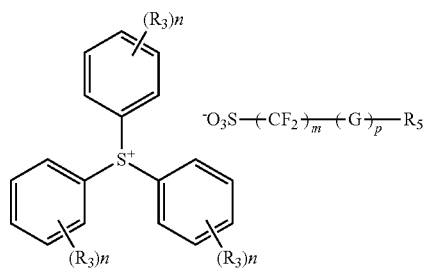

(B-b)

In the formula, each of $R_3$s independently represents a hydrogen atom, an optionally substituted alkyl group, an optionally substituted aryl group, an optionally substituted alkoxy group or an optionally substituted cycloalkyl group, G represents a linkage group, $R_5$ represents an organic group containing a heterocyclic group, or an optionally substituted aryl group, or an optionally substituted cycloalkyl group, m is an integer of 2 or greater, p is an integer of 0 or greater, and n is an integer of 0 to 5.

Provided that when p is 2 or greater, multiple Gs may be identical to or different from each other.

(11) The actinic ray-sensitive or radiation-sensitive resin composition according to item (10), characterized in that the linkage group represented by G in the formula (B-b) is any one, or a combination of two or more members, selected from among an optionally substituted alkyl group, an oxygen atom, a sulfur atom, —$SO_2$—, —$SO_3$— and —$CO_2$—.

(12) The actinic ray-sensitive or radiation-sensitive resin composition according to any of items (1) to (11), characterized in that an organic basic compound (C) is further contained therein.

(13) The actinic ray-sensitive or radiation-sensitive resin composition according to any of items (1) to (12), characterized in that a surfactant (D) is further contained therein.

(14) The actinic ray-sensitive or radiation-sensitive resin composition according to any of items (1) to (13), characterized in that a solvent is further contained therein.

(15) The actinic ray-sensitive or radiation-sensitive resin composition according to item (14)), characterized in that propylene glycol monomethyl ether acetate is contained as the solvent.

(16) The actinic ray-sensitive or radiation-sensitive resin composition according to item (15), characterized in that propylene glycol monomethyl ether is further contained as the solvent.

(17) A method of forming a pattern, characterized by including the steps of shaping the actinic ray-sensitive or radiation-sensitive resin composition according to any of items (1) to (16) into a film and subjecting the film to exposure to light and development.

Effect of the Invention

The actinic ray-sensitive or radiation-sensitive resin composition, especially a positive resist composition, of the present invention realizes not only satisfying the requirements of wide exposure latitude, decrease of line edge roughness, desirable pattern configuration and excellent dry etching resistance but also producing a pattern having less defects upon development.

DETAILED DESCRIPTION OF THE INVENTION

Now, the compounds for use in the present invention will be described in detail.

With respect to the expression of group (atomic group) used in this specification, the expression even when there is no mention of "substituted and unsubstituted" refers to groups not only having no substituent but also having substituents. For example, the "alkyl groups" refers not only to alkyls having no substituent (unsubstituted alkyls) but also alkyls having substituents (substituted alkyls).

[1] Resin (A)

The actinic ray-sensitive or radiation-sensitive resin composition of the present invention contains a resin containing the repeating units of formulae (I), (II) and (III) that when acted on by an acid, becomes soluble in an alkali developer (hereinafter, also referred to as "resin (A)").

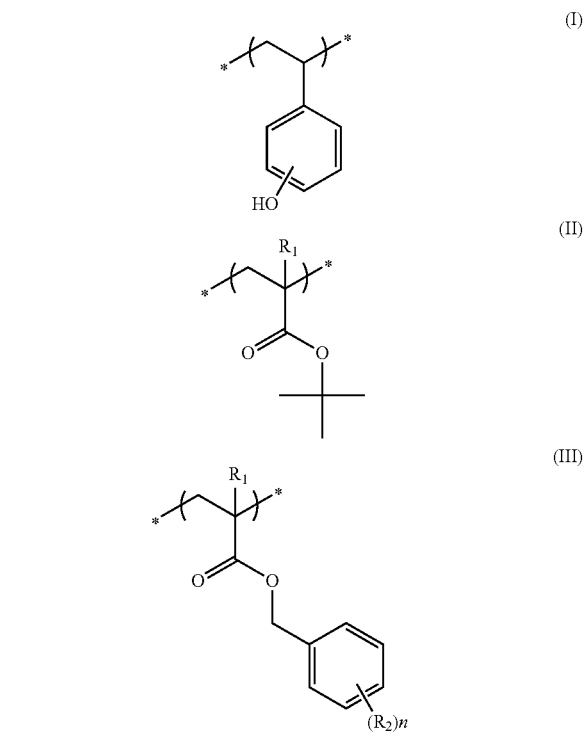

In the formulae (II) and (III), each of $R_1$s independently represents a hydrogen atom or an optionally substituted methyl group.

$R_2$ represents a halogen atom, an optionally substituted alkyl group, an optionally substituted cycloalkyl group, an optionally substituted aryl group or an optionally substituted aralkyl group, and n is an integer of 0 to 5, provided that when n is 2 or greater, multiple $R_2$s may be identical to or different from each other.

First, the repeating unit of formula (I) will be described.

In the present invention, as the repeating unit of formula (I), the resin (A) preferably contains at least either the structure of formula (I-a) or the structure of formula (I-b) and may contain both thereof. When both are contained, the resin (A) can be a mixture of a resin containing the structure of formula (I-a) and resin containing the structure of formula (I-b).

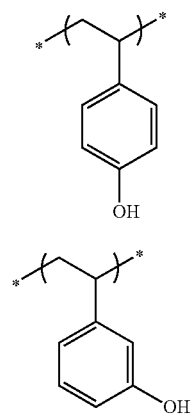

The compositional proportion of the repeating unit of formula (I) in the resin (A) is preferably in the range of 55 to 75 mol % based on all the repeating units of the resin (A). In a more preferred compositional proportion, the repeating unit of formula (I-a) is in the range of 55 to 75 mol % and the repeating unit of formula (I-b) in the range of 0 to 20 mol %.

Presence of the repeating unit of formula (I) in the above range is preferred from the viewpoint of a balance between line edge roughness and defect performance.

Now, the repeating unit of formula (II) will be described.

The repeating unit of formula (II) preferably has the following structures.

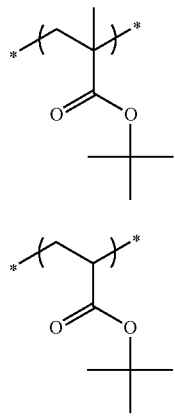

In the present invention, as the repeating unit of formula (II), the resin (A) especially preferably contains the structure of formula (II-a) and may contain both the structure of formula (II-a) and the structure of formula (II-b).

The compositional proportion of the repeating unit of formula (II) in the resin (A) is preferably in the range of 15 to 35 mol % based on all the repeating units of the resin (A). Causing the content of the repeating unit of formula (II) to fall within the above range is preferred from the viewpoint of simultaneous attainment of dissolution rate in an alkali developer and exposure latitude.

Below, the repeating unit of formula (III) will be described.

In the repeating unit of formula (III), $R_2$ represents a halogen atom, an alkyl group, a cycloalkyl group, an aryl group or an aralkyl group, and n is an integer of 0 to 5. From the viewpoint of dissolution rate in an alkali developer, it is preferred that n is zero.

The alkyl group represented by $R_2$ is preferably a linear or branched alkyl group having 1 to 12 carbon atoms. As such, there can be mentioned, for example, a methyl group, an ethyl group or a t-butyl group.

The cycloalkyl group represented by $R_2$ is preferably a cycloalkyl group having 5 to 30 carbon atoms.

As the aryl group represented by $R_2$, there can be mentioned, for example, an aryl group having 6 to 15 carbon atoms, such as a benzyl group or a naphthyl group.

The alkyl group, cycloalkyl group, aryl group or aralkyl group represented by $R_2$ may have a substituent. As the substituent, there can be mentioned an alkyl group, a cycloalkyl group, an aryl group or a halogen atom.

The compositional proportion of the repeating unit of formula (III) in the resin (A) is preferably in the range of 5 to 20 mol % based on all the repeating units of the resin (A). Causing the repeating unit of formula (III) to fall within the above range is preferred from the viewpoint of simultaneous attainment of satisfactory solubility at an exposure area while obtaining a pattern of rectangular configuration by a dissolution inhibiting effect.

Specific examples of the particular structures of the repeating units of formula (III) will be shown below, which however are nonlimiting.

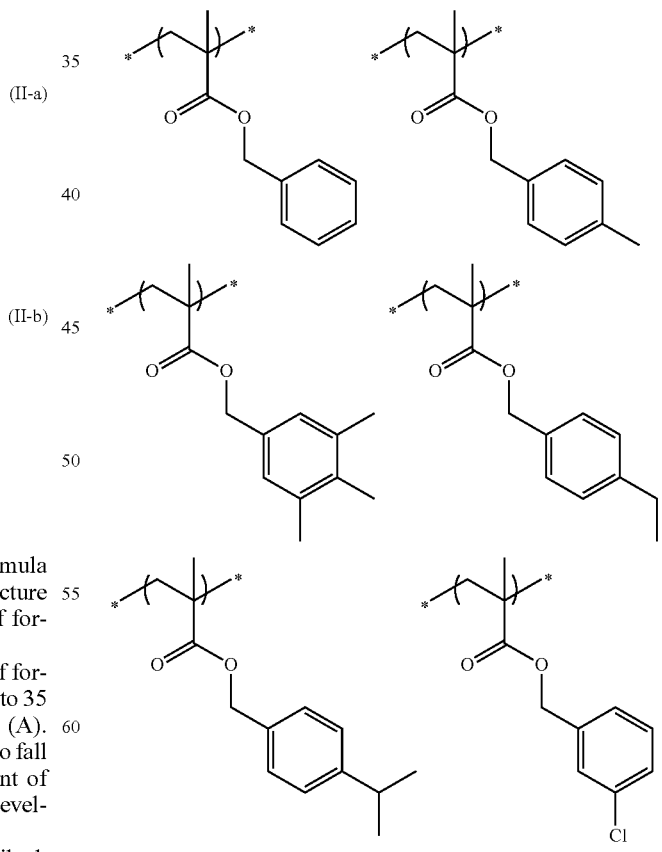

-continued

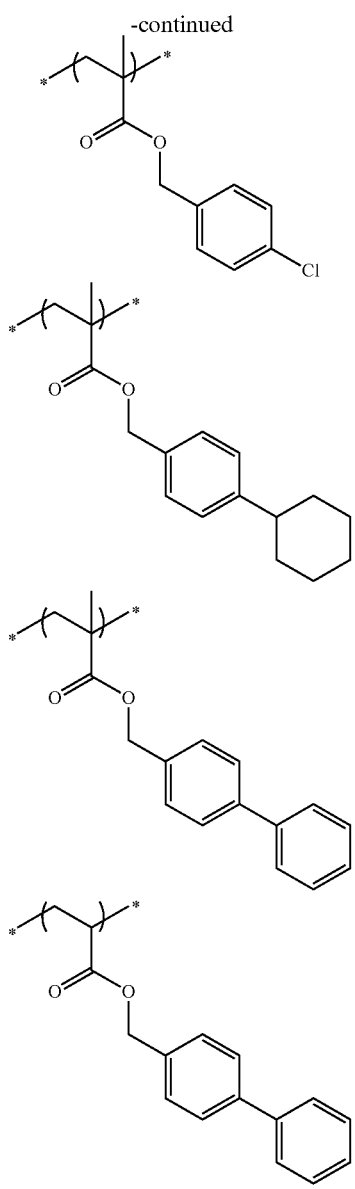

Preferably, the mass average molecular weight (Mw) of the resin (A) is in the range of 15,000 to 25,000. It is presumed that the mobility of the resist film would be reduced by increasing the molecular weight. Accordingly, causing the molecular weight (Mw) to be 15,000 or greater would enable inhibition of any diffusion of generated acid and enhance the performances of exposure latitude, standing wave, etc.

From the viewpoint of resin dissolution rate in alkali, sensitivity and defect occurrence, it is preferred that the mass average molecular weight (Mw) be not greater than 25,000.

The dispersity (Mw/Mn) is preferably in the range of 1.0 to 3.0, more preferably 1.0 to 2.5 and especially preferably 1.0 to 2.0.

The mass average molecular weight is defined in terms of polystyrene molecular weight by gel permeation chromatography.

The resin (A) exhibiting a dispersity of 1.5 to 2.0 can be synthesized by radical polymerization using a radical polymerization initiator. The resin (A) exhibiting a preferred dispersity of 1.0 to 1.5 can be synthesized by living radical polymerization.

Specific examples of the resins (A) will be shown below, which however are nonlimiting.

(A-1)
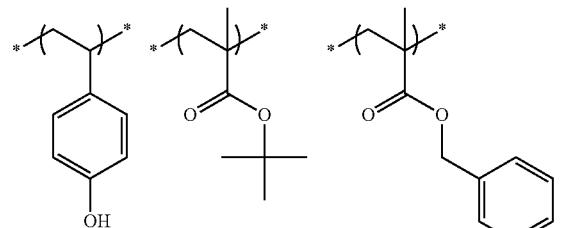

(A-2)
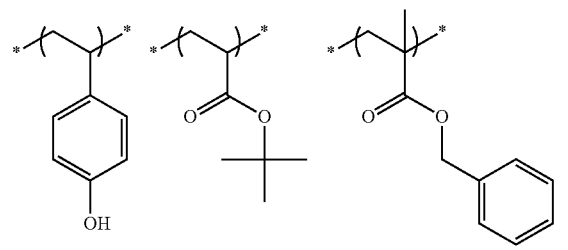

(A-3)
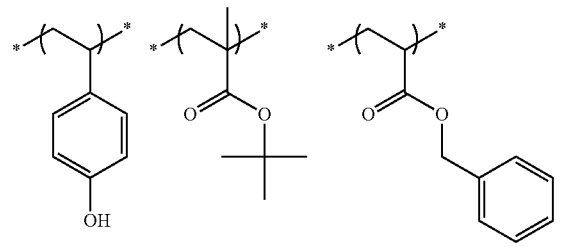

(A-4)
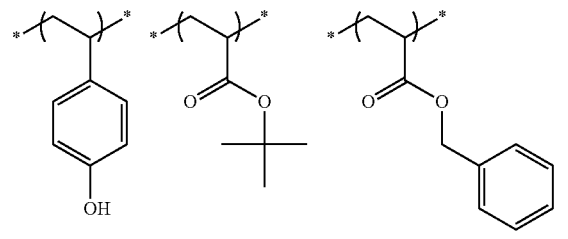

(A-5)
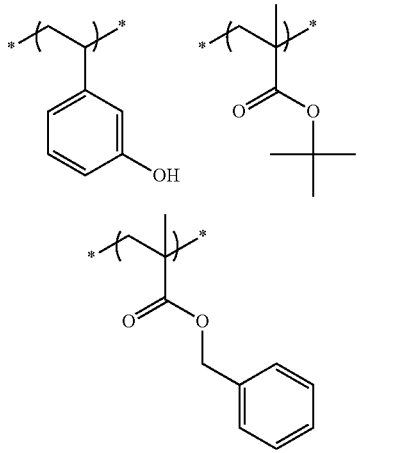

-continued
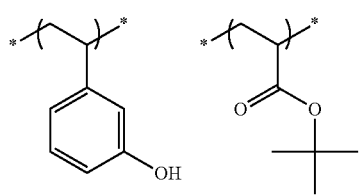
(A-6)
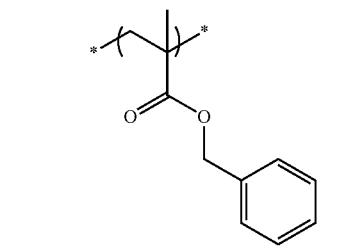
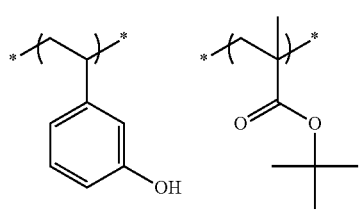
(A-7)
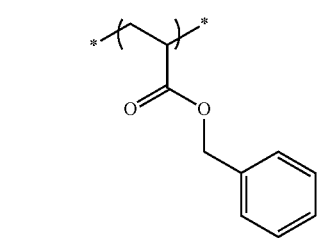
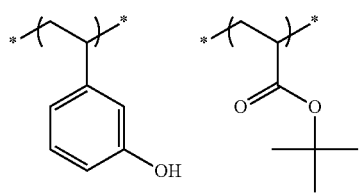
(A-8)
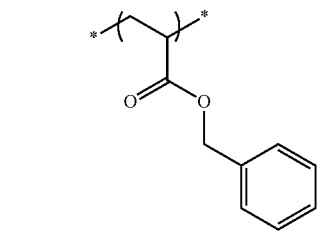
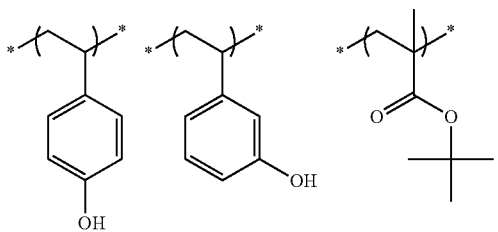
(A-9)
-continued
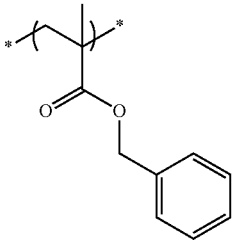
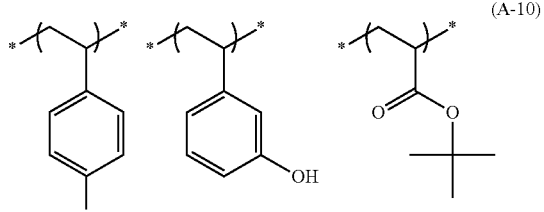
(A-10)
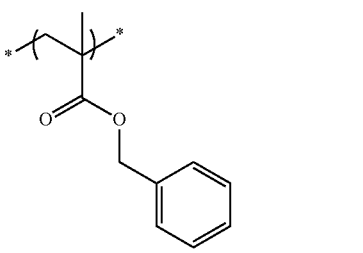
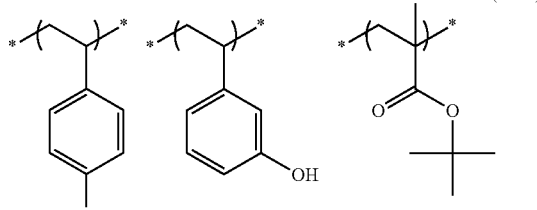
(A-11)
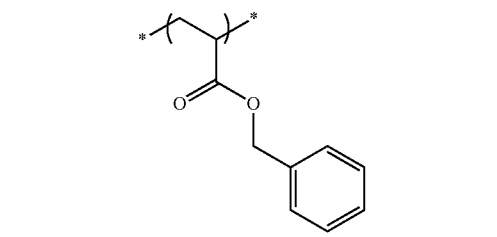
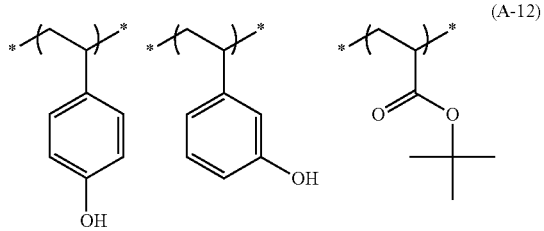
(A-12)
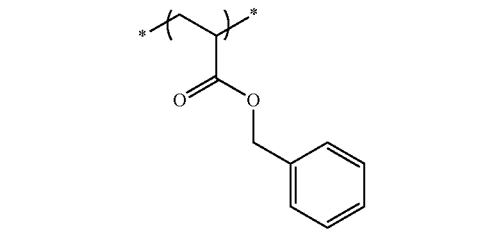

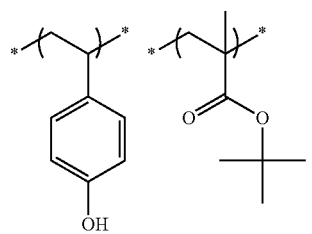
(A-13)
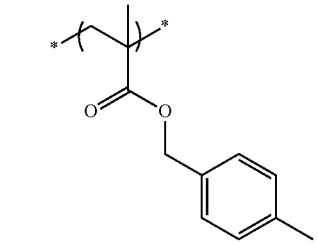
(A-14)
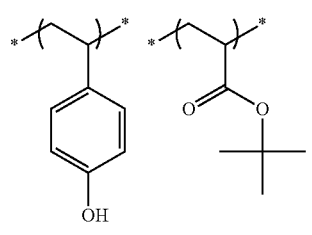
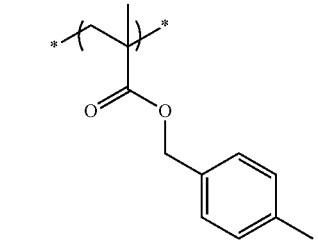
(A-15)
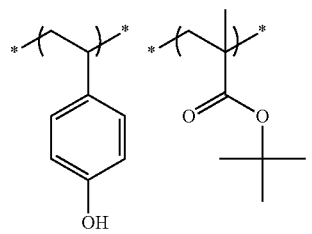
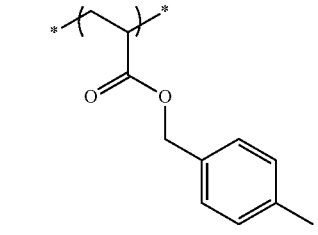
(A-16)
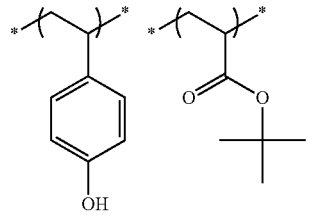
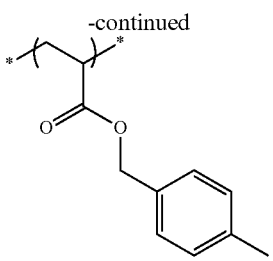
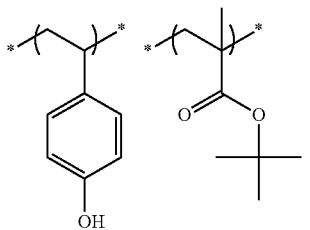
(A-17)
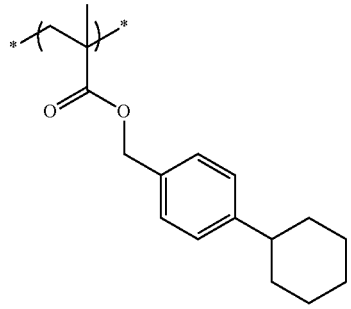
(A-18)
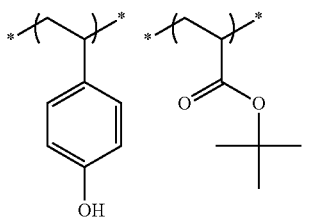
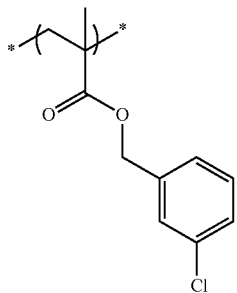
(A-19)
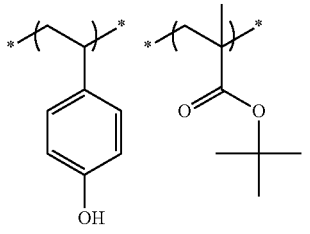

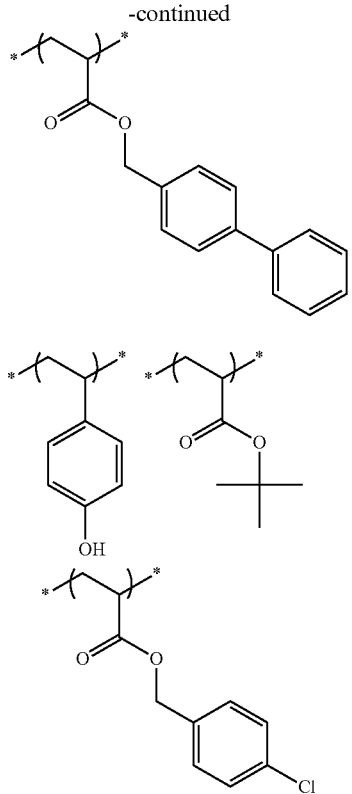

(A-20)

[2] Acid Generator (B)

The actinic ray-sensitive or radiation-sensitive resin composition of the present invention contains (B) a compound that when irradiated with actinic rays or radiation, generates a fluorine-containing acid (hereinafter also referred to as "acid generator (B)"). As the acid generator (B), use can be made of a member appropriately selected from among a photoinitiator for photocationic polymerization, a photoinitiator for photoradical polymerization, a photo-achromatic agent and photo-discoloring agent for dyes, any of publicly known compounds that when irradiated with actinic rays or radiation, generate a fluorine-containing acid, employed in a microresist, etc., and mixtures thereof.

For example, as the acid generator, there can be mentioned a fluorine-containing diazonium salt, phosphonium salt, sulfonium salt, iodonium salt, imide sulfonate, oxime sulfonate, diazosulfone, disulfone or o-nitrobenzyl sulfonate.

Further, use can be made of compounds obtained by introducing any of the groups or compounds that when irradiated with actinic rays or radiation, generate an acid in a polymer principal chain or side chain, for example, compounds described in U.S. Pat. No. 3,849,137, DE 3914407, Jpn. Pat. Appln. KOKAI Publication Nos. (hereinafter referred to as JP-A's) 63-26653, 55-164824, 62-69263, 63-146038, 63-163452, 62-153853, 63-146029, etc.

Furthermore, use can be made of compounds that when irradiated with light, generate an acid described in U.S. Pat. No. 3,779,778 and EP 126,712.

As preferred compounds among the compounds that when irradiated with actinic rays or radiation, are decomposed and generate a fluorine-containing acid, there can be mentioned those of the following general formulae (ZI), (ZII) and (ZIII).

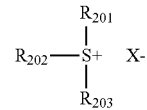

ZI

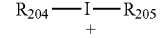

ZII

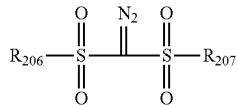

ZIII

In the above general formula (ZI) to (ZIII), each of $R_{201}$, $R_{202}$ and $R_{203}$ independently represents an organic group, for example, an aryl group, an alkyl group, a cycloalkyl group or the like.

The aryl group is preferably an aryl group such as a phenyl group or naphthyl group, or a teroaryl group such as an indole residue or pyrrole residue. More preferably, the aryl group is a phenyl group or an indole residue.

The alkyl group is preferably a linear or branched alkyl group having 1 to 15 carbon atoms. As such, there can be mentioned, for example, a methyl group, an ethyl group, a propyl group, an n-butyl group, a sec-butyl group, a t-butyl group or the like.

The cycloalkyl group is preferably a cycloalkyl group having 3 to 15 carbon atoms. As such, there can be mentioned, for example, a cyclopropyl group, a cyclobutyl group, a cyclohexyl group or the like.

This organic group may further have a substituent. As an optionally contained substituent, there can be mentioned, for example, a linear or branched alkyl group having 1 to 5 carbon atoms, a linear or branched alkoxy group having 1 to 5 carbon atoms, a cycloalkyl group having 5 to 8 carbon atoms, a halogen atom, a hydroxyl group, a phenylthio group or the like.

Any two of $R_{201}$, $R_{202}$ and $R_{203}$ may be bonded with each other to thereby form a ring structure.

In the compounds of the general formula (ZI), it is preferred that at least one of $R_{201}$, $R_{202}$ and $R_{203}$ be an aryl group. It is more preferred that all of $R_{201}$, $R_{202}$ and $R_{203}$ be aryl groups.

Each of $R_{204}$ and $R_{205}$ independently represents an organic group. As such, there can be mentioned, for example, the same organic groups as mentioned with respect to $R_{201}$, $R_{202}$ and $R_{203}$.

Each of $R_{206}$ and $R_{207}$ independently represents an organic group. As such, there can be mentioned, for example, the same organic groups as mentioned with respect to $R_{201}$, $R_{202}$ and $R_{203}$, provided that at least one of $R_{206}$ and $R_{207}$ is substituted with a fluorine atom.

Each of X⁻s of the general formulae (ZI) and (ZII) independently represents a fluorine-containing nonnucleophilic anion. As a preferred such nonnucleophilic anion, there can be mentioned a fluorine-containing sulfonate anion, bis(alkylsulfonyl)amido anion or tris(alkylsulfonyl)methide anion, $BF_4^-$, $PF_6^-$, $SbF_6^-$, etc. Especially preferably, such nonnucleophilic anion is an organic anion having a carbon atom and a fluorine atom.

As preferred organic anions, there can be mentioned those of the following formulae AN1 to AN3.

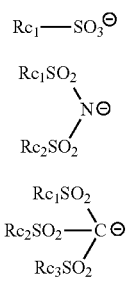

(AN1)
(AN2)
(AN3)

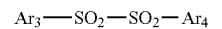

(ZIV)

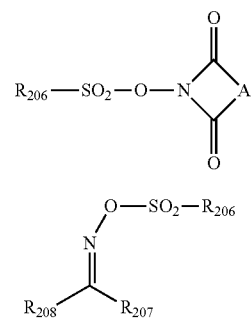

(ZV)

(ZVI)

In the formulae AN1 to AN3, each of $R_{C1}$ to $R_{C3}$ independently represents a fluorine-containing organic group. As the organic groups represented by $R_{C1}$ to $R_{C3}$, there can be mentioned those having 1 to 30 carbon atoms, for example, alkyl groups substituted at the 1-position thereof with a fluorine atom or a fluoroalkyl group, phenyl groups substituted with a fluorine atom or a fluoroalkyl group and groups derived from linkage of two or more thereof by means of a linkage group such as a single bond, —O—, —$CO_2$—, —S—, —$SO_3$— or —$SO_2N(Rd_1)$-. These may form a ring structure in cooperation with another bonded alkyl group or aryl group.

$Rd_1$ represents a hydrogen atom or an alkyl group, and may form a ring structure in cooperation with a bonded alkyl group or aryl group.

The possession of a fluorine atom or fluoroalkyl group would increase the acidity of acid generated by light irradiation to thereby attain a sensitivity enhancement. When 5 or more carbon atoms are contained in $R_{C1}$ to $R_{C3}$, it is preferred that at least one carbon atom thereof be substituted with a hydrogen atom. More preferably, the number of hydrogen atoms is greater than that of fluorine atoms. Not having a perfluoroalkyl group having 5 or more carbon atoms would lower the toxicity to ecology.

As preferred compounds among those that when irradiated with actinic rays or radiation, are decomposed to thereby generate a fluorine-containing acid, there can be further mentioned the compounds of the following general formulae (ZIV), (ZV) and (ZVI).

In the general formulae (ZIV) to (ZVI), each of $Ar_3$ and $Ar_4$ independently represents a substituted or unsubstituted aryl group, provided that at least one thereof is substituted with a fluorine atom.

Each of $R_{206}$s of the general formula (ZV) and general formula (ZVI) independently represents an alkyl group, a cycloalkyl group or an aryl group, provided that these groups are substituted with at least one fluorine atom.

Each of $R_{207}$ and $R_{208}$ independently represents an alkyl group, an aryl group or an electron-withdrawing group. $R_{207}$ is preferably an aryl group. $R_{208}$ is preferably an electron-withdrawing group, more preferably a cyano group or a fluoroalkyl group.

A represents an alkylene group, an alkenylene group or an arylene group.

In the present invention, also, a compound having multiple structures of the general formula (ZVI) is also preferred. For example, use may be made of a compound having such a structure that either $R_{207}$ or $R_{208}$ of any of compounds of the general formula (ZVI) is bonded with either $R_{207}$ or $R_{208}$ of another of compounds of the general formula (ZVI).

Specific examples of the acid generators (B) that generate a fluorine-containing acid will be shown below, which however are nonlimiting.

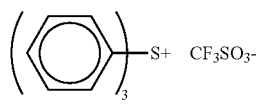 (B1)

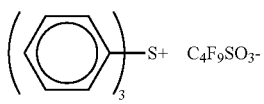 (B2)

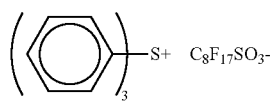 (B3)

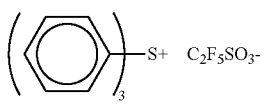 (B4)

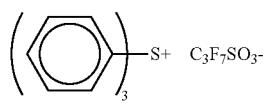 (B5)

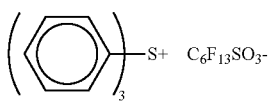 (B6)

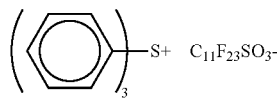 (B7)

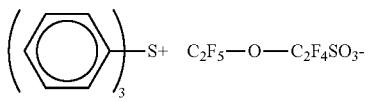 (B8)

(B9)
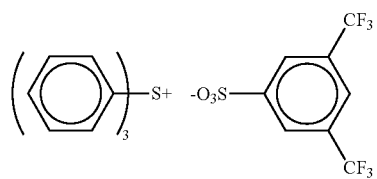
(B10)
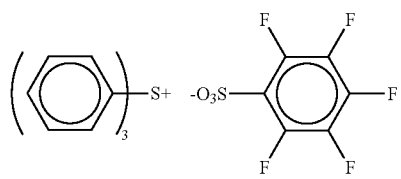
(B11)
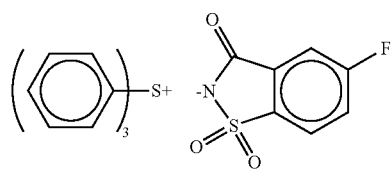
(B12)
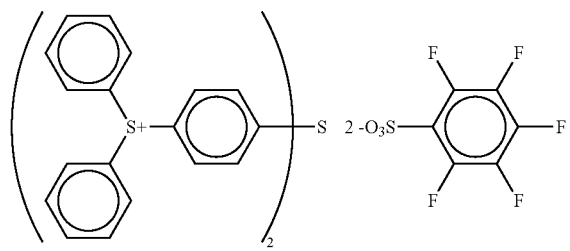
(B13)
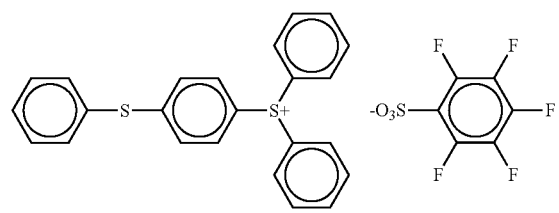
(B14)
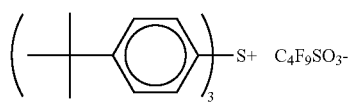
(B15)
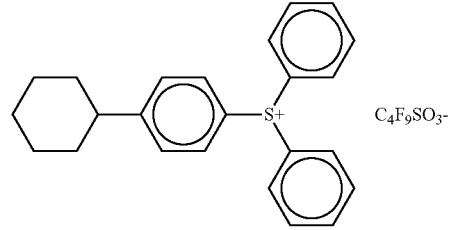
(B16)
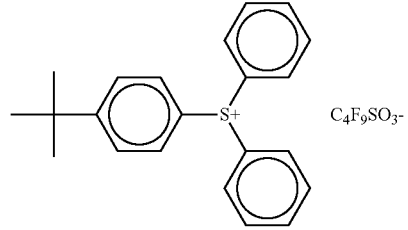
(B17)
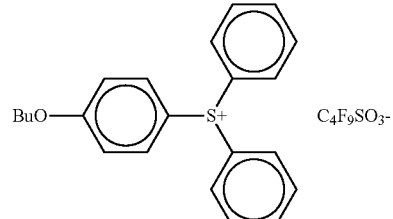
(B18)
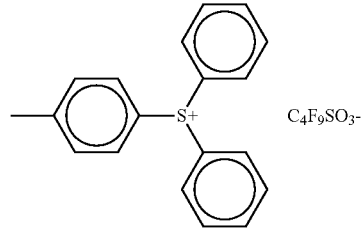
(B19)
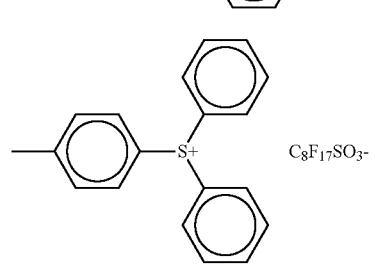
(B20)
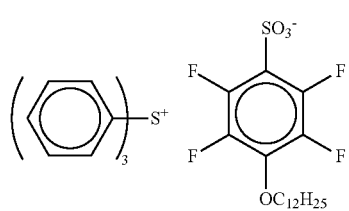
(B21)
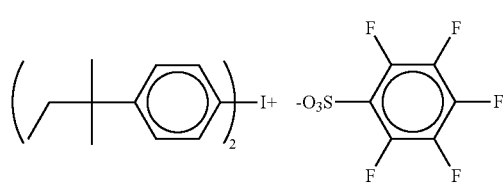
(B22)

-continued
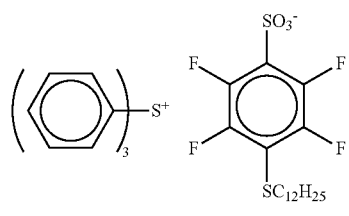
(B23)
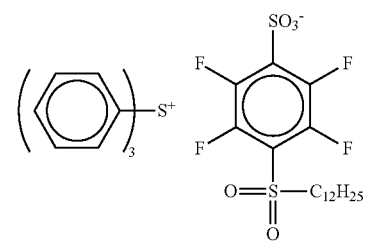
(B24)
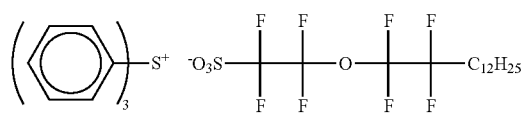
(B25)
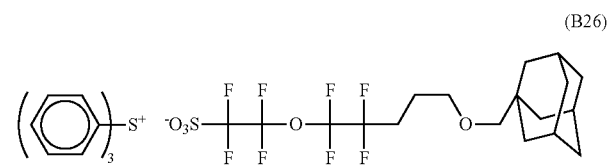
(B26)
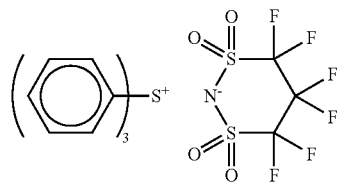
(B27)
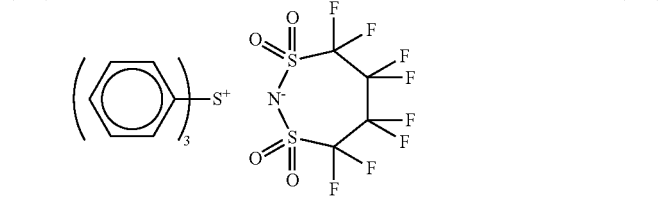
(B28)
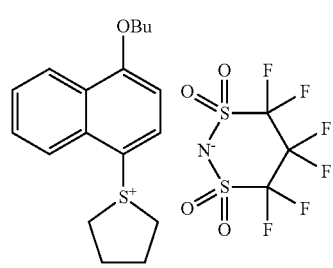
(B29)
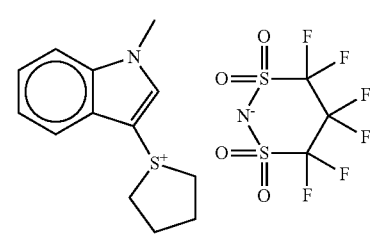
(B30)
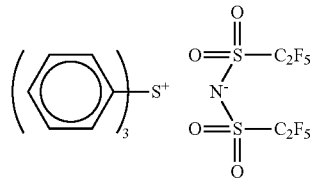
(B31)
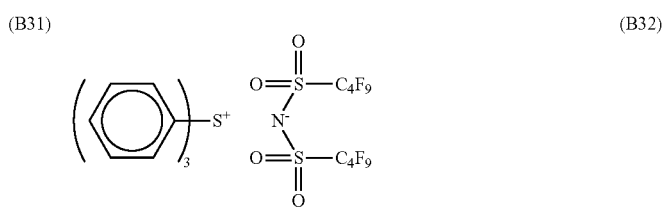
(B32)
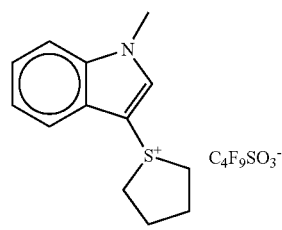
(B33)
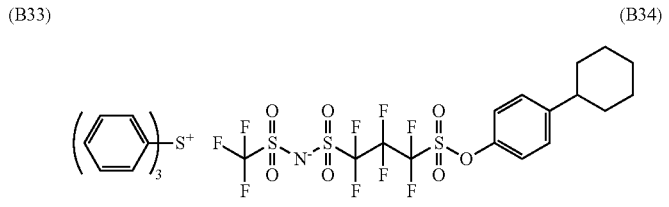
(B34)

-continued

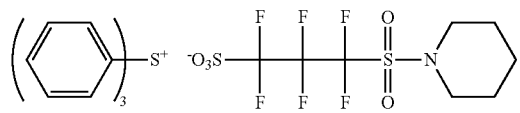
(B35)

(B36)

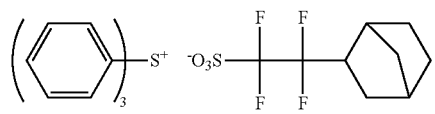
(B37)

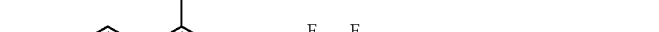
(B38)

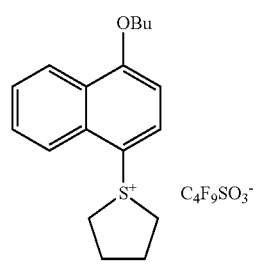
(B39)

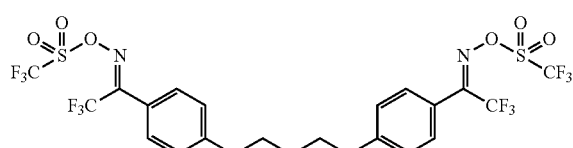
(B40)

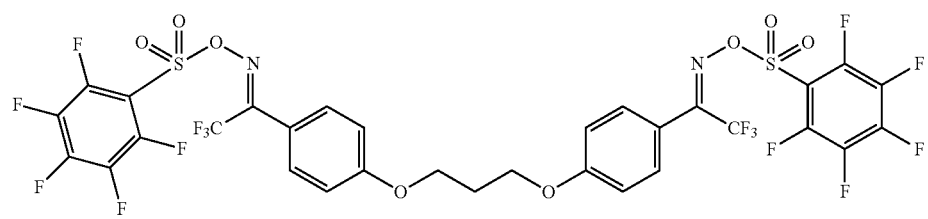
(B41)

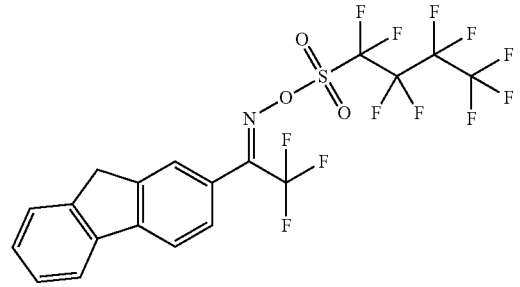
(B42)

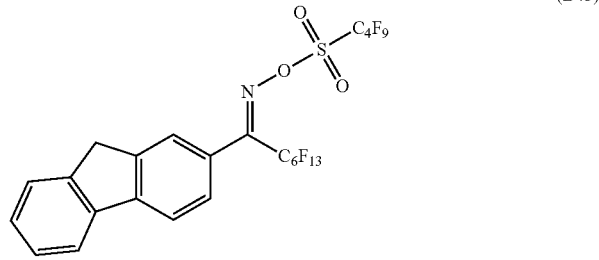
(B43)

In the present invention, it is preferred that the acid generator (B) be any of compounds of formula (B-a) or any of compounds of formula (B-b).

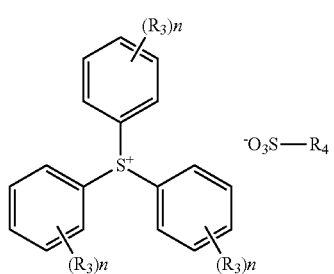
(B-a)

In the formula, each of $R_3$s independently represents a hydrogen atom, an optionally substituted alkyl group, an optionally substituted aryl group, an optionally substituted alkoxy group or an optionally substituted cycloalkyl group.

$R_4$ represents a phenyl group substituted with at least a fluorine atom and/or a fluoroalkyl group.

n is an integer of 0 to 5.

Specific examples of $R_3$s include a hydrogen atom, an optionally substituted linear or branched alkyl group having 1 to 5 carbon atoms, an optionally substituted phenyl or other aryl group, an optionally substituted linear or branched alkoxy group having 1 to 5 carbon atoms and an optionally substituted cycloalkyl group of a single ring or multiple rings having 5 to 20 carbon atoms. These are however nonlimiting.

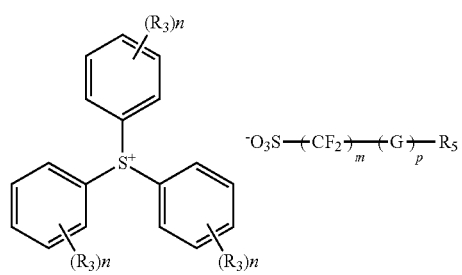
(B-b)

In the formula, each of $R_3$s independently represents a hydrogen atom, an optionally substituted alkyl group, an optionally substituted aryl group, an optionally substituted alkoxy group or an optionally substituted cycloalkyl group.

G represents a linkage group.

$R_5$ represents an organic group containing a heterocyclic group, or an optionally substituted aryl group, or an optionally substituted cycloalkyl group of a single ring or multiple rings.

m is an integer of 2 or greater.

p is an integer of 0 or greater.

n is an integer of 0 to 5.

When p is 2 or greater, the multiple Gs may be identical to or different from each other.

The linkage group represented by G in the formula (B-b) can be any one, or a combination of two or more members, selected from among an optionally substituted alkyl group, an oxygen atom, a sulfur atom, —$SO_2$—, —$SO_3$— and —$CO_2$—. Of these, an oxygen atom, —$SO_2$— and —$SO_3$— are especially preferred.

Specific examples of $R_3$s are the same as mentioned with respect to the $R_3$s of the formula (B-a).

Specific examples of the heterocycles contained in $R_5$ will be shown below, which are however nonlimiting.

(K1)

(K2)

(K3)

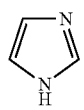
(K4)

(K5)

(K6)

(K7)

(K8)

(K9)

(K10)

(K11)

(K12)

(K13)

(K14)

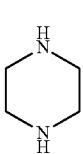
(K15)

(K16)

As the aryl group contained in $R_5$, there can be mentioned, for example, optionally substituted aryl groups having 6 to 20 carbon atoms, which are however nonlimiting.

As the cycloalkyl group contained in $R_5$, there can be mentioned, for example, optionally substituted cycloalkyl groups of a single ring or multiple rings having 3 to 20 carbon atoms, which are however nonlimiting.

As specific examples of the acid generators (B) of formulae (B-a) and (B-b), there can be mentioned not only the above compounds of formulae (B9), (B10), (B22), (B23), (B24), (B26), (B35), (B36) and (B37) but also the following compounds of formulae (B44) to (B54), which are however nonlimiting.

(B44) 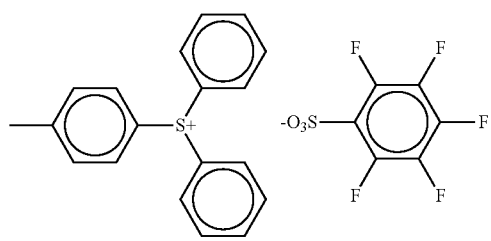

(B45) 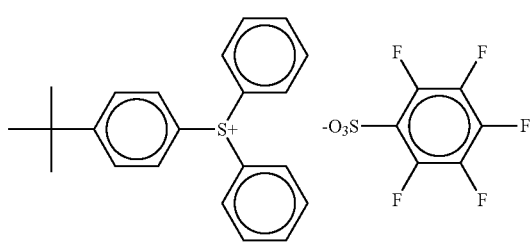

(B46) 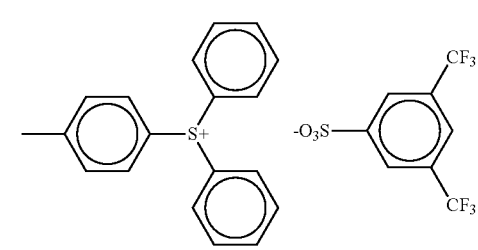

(B47) 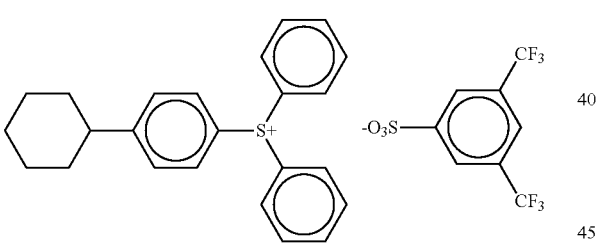

(B48) 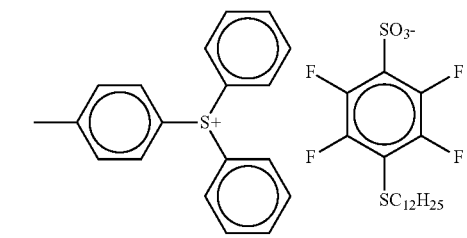

(B49) 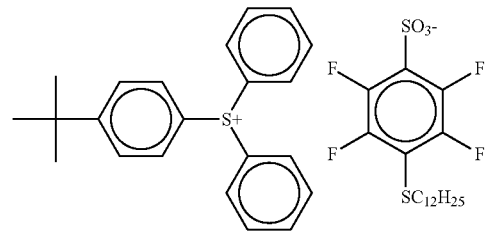

-continued (B50) 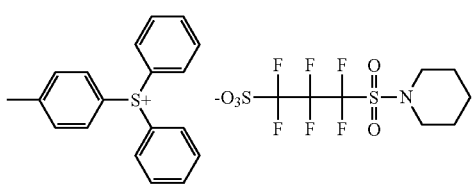

(B51) 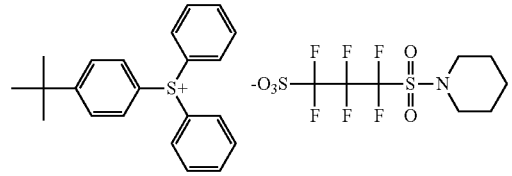

(B52) 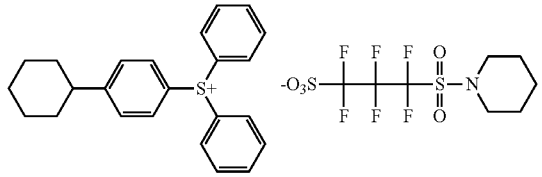

(B53) 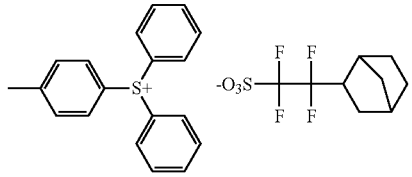

(B54) 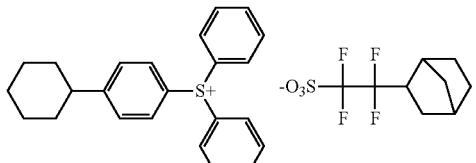

The acid generators (B) can be used either individually or in combination.

The content of acid generator (B) in the composition is preferably in the range of 0.1 to 20 mass %, more preferably 0.5 to 10 mass % and still more preferably 1 to 7 mass % based on the total solid of the composition of the present invention.

The composition of the present invention may further contain an acid generator other than acid generators (B) that when irradiated with actinic rays or radiation, generates an acid containing no fluorine atom.

Specific examples of the acid generators that generate an acid containing no fluorine will be shown below, which are however nonlimiting.

(B55) (Ph)₃S⁺ CH₃SO₃⁻

(B56) (Ph)₃S⁺ C₄H₉SO₃⁻

(B57) (Ph)₃S⁺ C₈H₁₇SO₃⁻

(B58) (Ph)₃S⁺ C₂H₅SO₃⁻

(B59) (Ph)₃S⁺ C₃H₇SO₃⁻

(B60) (Ph)₃S⁺ C₆H₁₃SO₃⁻

(B61) (Ph)₃S⁺ C₁₂H₂₅SO₃⁻

(B62) (Ph)₃S⁺ C₁₆H₃₃SO₃⁻

(B63) (Ph)₃S⁺ saccharinate (B64) (Ph)₃S⁺ ⁻O₃S–C₆H₄–CH₃

(B65) (Ph)₃S⁺ ⁻O₃S–(2,4,6-triisopropylphenyl)

(B66) (Ph)₃S⁺ camphorsulfonate (B67) (tBu–C₆H₄)₃S⁺ C₁₆H₃₃SO₃⁻  (with tolyl/diphenyl sulfonium C₁₆H₃₃SO₃⁻)

(B68) (tBu–C₆H₄)₃S⁺ C₁₆H₃₃SO₃⁻

(B69) (cyclohexyl-C₆H₄)(Ph)₂S⁺ C₁₆H₃₃SO₃⁻

(B70) (tBu–C₆H₄)(Ph)₂S⁺ C₁₆H₃₃SO₃⁻

(B71) (BuO–C₆H₄)(Ph)₂S⁺ C₁₆H₃₃SO₃⁻

(B72) (tBu–C₆H₄)₂I⁺ C₁₆H₃₃SO₃⁻

-continued
(B73)
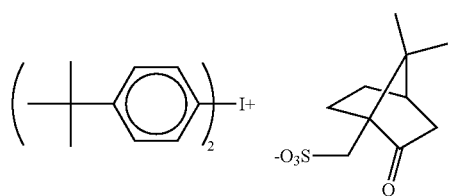
(B74)
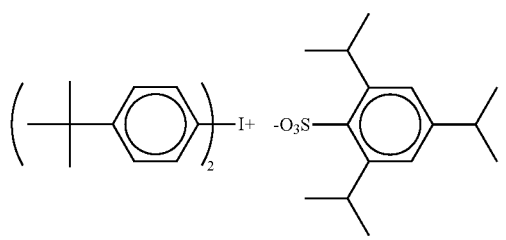
(B75)
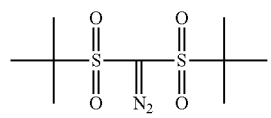
(B76)
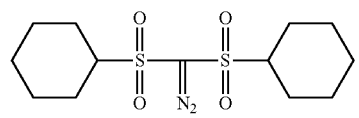
(B77)
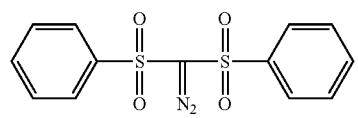
(B78)
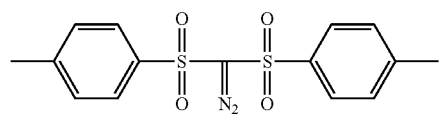
(B79)
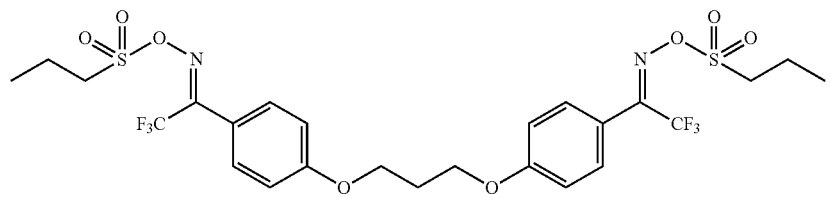
(B80)
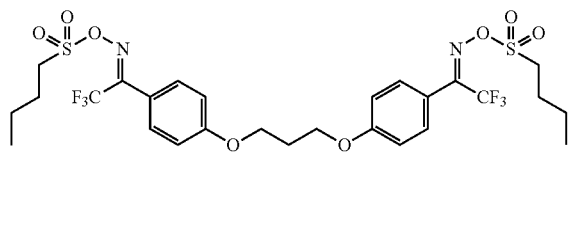
(B81)
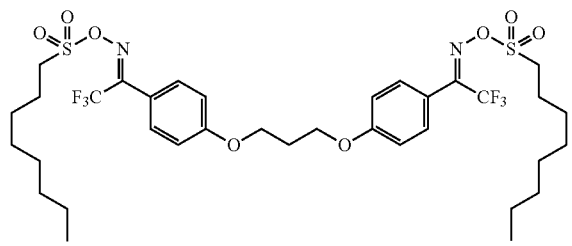
(B82)
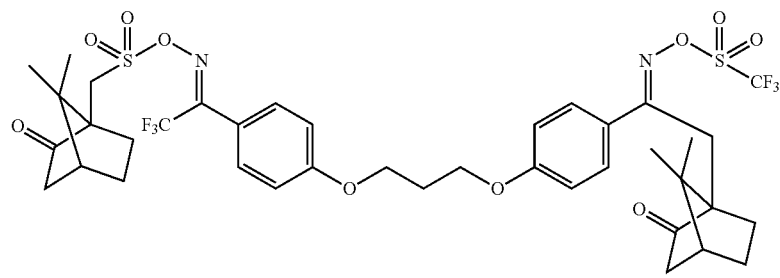
(B83)
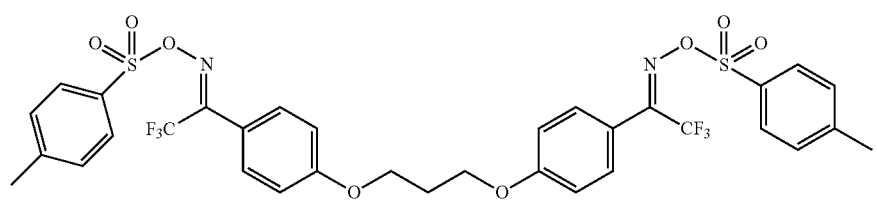

-continued

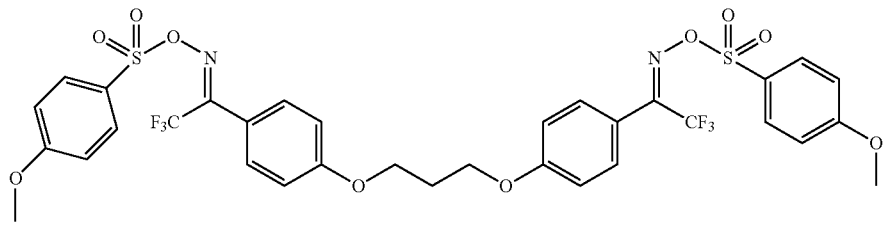
(B84)

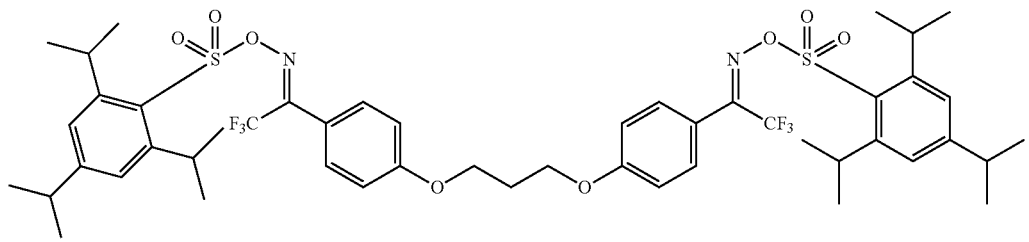
(B85)

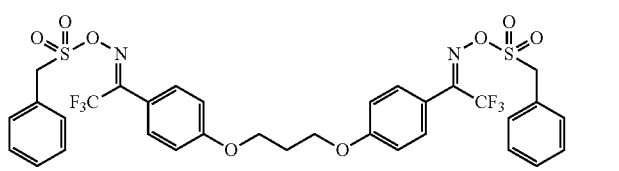
(B86)

(B87)

[3] Organic Basic Compound (C)

The composition of the present invention preferably contains an organic basic compound. The organic basic compound is preferably a compound of basicity higher than that of phenol. The molecular weight of the organic basic compound is generally in the range of 100 to 900, preferably 150 to 800 and more preferably 200 to 700. A nitrogenous basic compound is especially preferred.

From the viewpoint of a preferred chemical environment, the nitrogenous basic compound is preferably any of those having the structures of the following formulae (CI) to (CV). The formulae (CII) to (CV) may represent part of a ring structure.

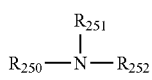
(CI)

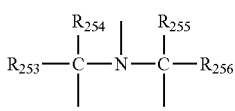
(CII)

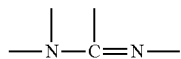
(CIII)

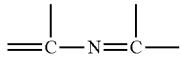
(CIV)

(CV)

In the formulae, $R_{250}$, $R_{251}$ and $R_{252}$ may be identical to or different from each other and each represent a hydrogen atom, an alkyl group (preferably having 1 to 20 carbon atoms), a cycloalkyl group (preferably having 3 to 20 carbon atoms) or an aryl group (preferably having 6 to 20 carbon atoms). $R_{251}$ and $R_{252}$ may be bonded with each other to thereby form a ring.

The above alkyl group may be unsubstituted or may have a substituent. The alkyl group having a substituent is preferably an aminoalkyl group having 1 to 6 carbon atoms or a hydroxyalkyl group having 1 to 6 carbon atoms.

$R_{253}$, $R_{254}$, $R_{255}$ and $R_{256}$ may be identical with or different from each other and each represent an alkyl group having 1 to 6 carbon atoms.

The more preferred compound is a nitrogenous basic compound having two or more nitrogen atoms of different chemical environments in each molecule. The especially preferred compound is a compound containing both a substituted or unsubstituted amino group and a nitrogen-atom-containing ring structure, or a compound having an alkylamino group.

Furthermore, there can be mentioned at least one nitrogenous compound selected from among an amine compound having a phenoxy group, an ammonium salt compound having a phenoxy group, an amine compound having a sulfonic ester group and an ammonium salt compound having a sulfonic ester group.

With respect to the above amine compound having a phenoxy group, ammonium salt compound having a phenoxy group, amine compound having a sulfonic ester group and ammonium salt compound having a sulfonic ester group, it is preferred that at least one alkyl group be bonded to the nitrogen atom thereof. Further, preferably, the alkyl chain contains an oxygen atom, thereby forming an oxyalkylene group. The number of oxyalkylene groups in each molecule is one or more, preferably 3 to 9 and still preferably 4 to 6. Oxyalkylene groups having the structure of —$CH_2CH_2O$—, —$CH(CH_3)CH_2O$— or —$CH_2CH_2CH_2O$— are preferred.

As specific examples of the above amine compound having a phenoxy group, ammonium salt compound having a phenoxy group, amine compound having a sulfonic ester group and ammonium salt compound having a sulfonic ester group, there can be mentioned the compounds (C1-1) to (C3-3) shown in Paragraph [0066] of US 2007/0224539 A, which are however nonlimiting.

As preferred organic basic compounds, there can be mentioned guanidine, aminopyridine, aminoalkylpyridine, aminopyrrolidine, indazole, imidazole, pyrazole, pyrazine, pyrimidine, purine, imidazoline, pyrazoline, piperazine, aminomorpholine, aminoalkylmorpholine and the like. These may have a substituent. As preferred substituents, there can be mentioned an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group, a cyano group and the like.

As especially preferred organic basic compounds, there can be mentioned guanidine, 1,1-dimethylguanidine, 1,1,3,3-tetramethyl guanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine and the like. However, these are nonlimiting.

Moreover, use can be made of nitrogenous basic compounds of a tetraalkylammonium salt type. Of these, tetraalkylammonium hydroxides having 1 to 8 carbon atoms (for example, tetramethylammonium hydroxide, tetraethylammonium hydroxide and tetra(n-butyl)ammonium hydroxide) are especially preferred. These nitrogenous basic compounds are used either individually or in combination.

With respect to the ratio of the compound that when irradiated with actinic rays or radiation, generates an acid to organic basic compound (C) used in the composition, preferably, the organic basic compound/acid generator (molar ratio) =0.01 to 10. The reason for this is that the molar ratio is preferred to be 10 or below from the viewpoint of sensitivity and resolving power. The molar ratio is preferred to be 0.01 or higher from the viewpoint of inhibition of resolving power drop due to thickening of a resist pattern over time up to heating treatment after exposure. The organic basic compound/acid generator (molar ratio) is more preferably in the range of 0.05 to 5, still more preferably 0.1 to 3.

[4] Surfactant (D)

In the present invention, use can be made of a surfactant or the like. The use thereof is preferred from the viewpoint of film forming capability, pattern adhesion, development defect reduction, etc.

As specific examples of surfactants, there can be mentioned nonionic surfactants consisting of a polyoxyethylene alkyl ether such as polyoxyethylene lauryl ether, polyoxyethylene stearyl ether, polyoxyethylene cetyl ether or polyoxyethylene oleyl ether, a polyoxyethylene alkylaryl ether such as polyoxyethylene octylphenol ether or polyoxyethylene nonylphenol ether, a polyoxyethylene-polyoxypropylene block copolymer, a sorbitan fatty acid ester such as sorbitan monolaurate, sorbitan monopalmitate, sorbitan monostearate, sorbitan monooleate, sorbitan trioleate or sorbitan tristearate, a polyoxyethylene sorbitan fatty acid ester such as polyoxyethylene sorbitan monolaurate, polyoxyethylene sorbitan monopalmitate, polyoxyethylene sorbitan monostearate, polyoxyethylene sorbitan trioleate or polyoxyethylene sorbitan tristearate, and the like; fluorinated surfactants/siliconized surfactants, such as Eftop EF301, EF303 and EF352 (produced by Shin-Akita Kasei Co., Ltd.), Megafac F171 and F173 (produced by Dainippon Ink & Chemicals, Inc.), Florad FC430 and FC431 (produced by Sumitomo 3M Ltd.), Asahi guard AG710 and Surflon S-382, SC101, SC102, SC103, SC104, SC105 and SC106 (produced by Asahi Glass Co., Ltd.), Troy Sol S-366 (produced by Troy Chemical Co., Ltd.), and the like; and organosiloxane polymer KP-341 (produced by Shin-Etsu Chemical Co., Ltd.), acrylic or methacrylic (co)polymer Polyflow No. 75 and No. 95 (produced by Kyoeisha Chemical Co., Ltd.), and the like. With respect to the addition amount of these surfactants, each is added in an amount of generally 2 parts by mass or less, preferably 1 part by mass or less per 100 parts by mass of the solid components of the composition of the present invention.

These surfactants may be used either individually or in combination.

As the surfactant, it is preferred that any one or two or more members selected from among fluorinated and/or siliconized surfactants (fluorinated surfactant, siliconized surfactant and surfactant containing both a fluorine atom and a silicon atom) be contained.

As the above surfactants, there can be mentioned, for example, those described in JP-A's-62-36663, 61-226746, 61-226745, 62-170950, 63-34540, 7-230165, 8-62834, 9-54432, 9-5988 and 2002-277862 and U.S. Pat. Nos. 5,405,720, 5,360,692, 5,529,881, 5,296,330, 5,436,098, 5,576,143, 5,294,511 and 5,824,451. Any of the following commercially available surfactants can be used as is.

As useful commercially available surfactants, there can be mentioned, for example, fluorinated surfactants/siliconized surfactants, such as Eftop EF301 and EF303 (produced by Shin-Akita Kasei Co., Ltd.), Florad FC 430 and 431 (produced by Sumitomo 3M Ltd.), Megafac F171, F173, F176, F189 and R08 (produced by Dainippon Ink & Chemicals, Inc.), Surflon S-382, SC101, 102, 103, 104, 105 and 106 (produced by Asahi Glass Co., Ltd.), Troy Sol S-366 (produced by Troy Chemical Co., Ltd.) and the like. Further, polysiloxane polymer KP-341 (produced by Shin-Etsu Chemical Co., Ltd.) can be employed as the siliconized surfactant.

As the surfactant, besides the above publicly known surfactants, use can be made of a surfactant based on a polymer having a fluorinated aliphatic group derived from a fluorinated aliphatic compound produced by a telomerization technique (also called a telomer process) or an oligomerization technique (also called an oligomer process). The fluorinated aliphatic compound can be synthesized by the process described in JP-A-2002-90991.

For example, as a commercially available surfactant, there can be mentioned Megafac F178, F-470, F-473, F-475, F-476 or F-472 (produced by Dainippon Ink & Chemicals, Inc.). Further, there can be mentioned a copolymer from an acrylate (or methacrylate) having a $C_6F_{13}$ group and a poly(oxyalkylene)acrylate (or methacrylate), a copolymer from an acrylate (or methacrylate) having a $C_6F_{13}$ group, poly(oxyethylene)acrylate (or methacrylate) and poly(oxypropylene)acrylate (or methacrylate), a copolymer from an acrylate (or methacrylate) having a $C_8F_{17}$ group and a poly(oxyalkylene)acrylate (or methacrylate), a copolymer from an acrylate (or methacrylate) having a $C_8F_{17}$ group, poly(oxyethylene)acrylate (or methacrylate) and poly(oxypropylene)acrylate (or methacrylate), or the like.

The amount of surfactant used is preferably in the range of 0.0001 to 2 mass %, more preferably 0.001 to 1 mass % based on the total solid of the composition of the present invention.

[5] Solvent

The composition of the present invention is dissolved in a solvent capable of dissolving the above components and applied onto a support. The solid content based on the whole composition is generally preferred to be in the range of 2 to 30 mass %, especially 3 to 25 mass %.

Preferred employable solvents include ethylene dichloride, cyclohexanone, cyclopentanone, anisole, 2-heptanone, γ-butyrolactone, methyl ethyl ketone, ethylene glycol monomethyl ether, ethylene glycol monoethyl ether, 2-methoxyethyl acetate, ethylene glycol monomethyl ether acetate, ethylene glycol monoethyl ether acetate, propylene glycol monomethyl ether, propylene glycol monomethyl ether acetate, toluene, ethyl acetate, methyl lactate, ethyl lactate, butyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, tetrahydrofuran, methyl 3-methoxypropionate and the like. These solvents may be used either individually or in combination.

Preferably, the solvent is one containing propylene glycol monomethyl ether acetate. More preferably, the solvent is one consisting of propylene glycol monomethyl ether acetate only or a mixed solvent containing propylene glycol monomethyl ether acetate and any one of propylene glycol monomethyl ether, ethyl lactate and methyl methoxypropionate.

[6] Other Additives

The composition of the present invention can further contain a photo-base generator and other additives according to necessity.

1. Photo-Base Generator

As the photo-base generator that can be added to the composition of the present invention, there can be mentioned any of compounds described in JP-A's-4-151156, 4-162040, 5-197148, 5-5995, 6-194834, 8-146608 and 10-83079 and EP 622682. In particular, suitable use can be made of 2-nitrobenzyl carbamate, 2,5-dinitrobenzylcyclohexyl carbamate, N-cyclohexyl-4-methylphecylsulfonamide, 1,1-dimethyl-2-phenylethyl N-isopropylcarbamate or the like. These photo-base generators are added for the purpose of improvement of resist configuration, etc.

2. Carboxylic Acid Generator (E)

Use may be made of a compound that when irradiated with actinic rays or radiation, generates a carboxylic acid (hereinafter also referred to as compound (E) or a carboxylic acid generator).

Any of the compounds of the following general formula (E) is preferred as the carboxylic acid generator.

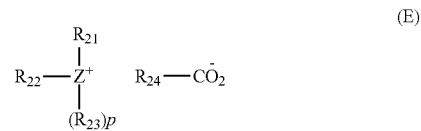

In the general formula (E), each of $R_{21}$ to $R_{23}$ independently represents an alkyl group, a cycloalkyl group, an alkenyl group or an aryl group. $R_{24}$ represents a hydrogen atom, an alkyl group, a cycloalkyl group, an alkenyl group or an aryl group. Z represents a sulfur atom or an iodine atom. When Z is a sulfur atom, p is 1. When Z is an iodine atom, p is 0.

In the general formula (E), each of the groups represented by $R_{21}$ to $R_{23}$ may have a substituent. As the substituent, there can be mentioned, for example, a halogen atom (for example, a chlorine atom, a bromine atom or a fluorine atom), an aryl group (for example, a phenyl group or a naphthyl group), a hydroxyl group, an alkoxy group (for example, a methoxy group, an ethoxy group or a butoxy group), a nitro group, a cyano group or the like.

Preferably, each of $R_{21}$ to $R_{23}$ represents an alkyl group having 1 to 12 carbon atoms, a cycloalkyl group having 3 to 12 carbon atoms, an alkenyl group having 2 to 12 carbon atoms or an aryl group having 6 to 24 carbon atoms. More preferably, each of $R_{21}$ to $R_{23}$ represents an alkyl group having 1 to 6 carbon atoms, a cycloalkyl group having 3 to 6 carbon atoms or an aryl group having 6 to 18 carbon atoms. Especially preferably, each of $R_{21}$ to $R_{23}$ represents an aryl group having 6 to 15 carbon atoms.

$R_{24}$ represents a hydrogen atom, an alkyl group, a cycloalkyl group, an alkenyl group or an aryl group. As examples of the substituents that may be contained in the alkyl group, cycloalkyl group, and alkenyl group, there can be mentioned the same as mentioned with respect to $R_{21}$ to $R_{23}$.

Preferably, $R_{24}$ represents a hydrogen atom, an alkyl group having 1 to 30 carbon atoms, a cycloalkyl group having 3 to 30 carbon atoms, an alkenyl group having 2 to 30 carbon atoms or an aryl group having 6 to 24 carbon atoms. More preferably, $R_{24}$ represents an alkyl group having 1 to 18 carbon atoms, a cycloalkyl group having 3 to 18 carbon atoms or an aryl group having 6 to 18 carbon atoms. Especially preferably, $R_{24}$ represents an alkyl group having 1 to 12 carbon atoms, a cycloalkyl group having 3 to 12 carbon atoms or an aryl group having 6 to 15 carbon atoms. Each of these groups may have a substituent.

Z represents a sulfur atom or an iodine atom. When Z is a sulfur atom, p is 1. When Z is an iodine atom, p is 0.

Two or more cation moieties of the formula (E) may be bonded with each other by a single bond or linkage group (for example, —S—, —O— or the like) to thereby form a cation structure having multiple cation moieties of the formula (E).

Specific preferred examples of the compounds (E) that when irradiated with actinic rays or radiation, generate a carboxylic acid will be shown below, which are however naturally nonlimiting.

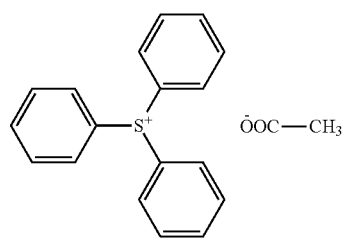
(E-1)

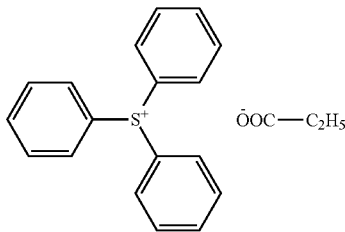
(E-2)

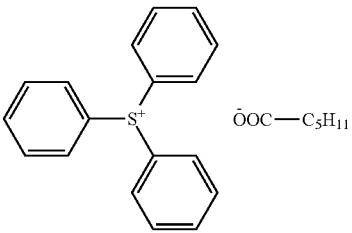
(E-3)

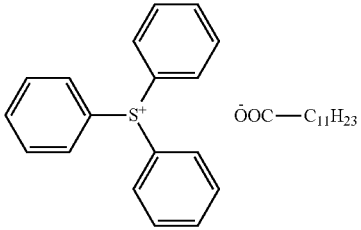
(E-4)

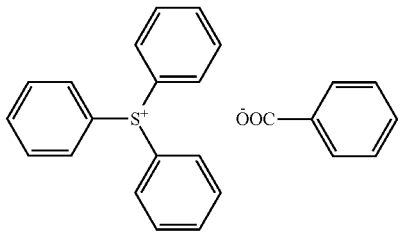
(E-5)

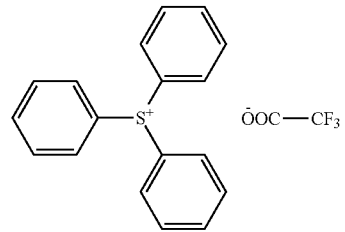
(E-6)

(E-7)

(E-8)

(E-9)

(E-10)

The content of compound (E) in the composition is preferably in the range of 0 to 10 mass %, more preferably 0 to 5 mass % and especially preferably 0 to 3 mass % based on the total solid of the composition. These compounds that when irradiated with actinic rays or radiation, generate a carboxylic acid may be used either individually or in mixture.

3. Antioxidant

The composition of the present invention may contain an antioxidant.

The antioxidant is for inhibition of any oxidation of organic material in the presence of oxygen.

The antioxidant is not particularly limited as long as it is customarily employed as being effective in the inhibition of any oxidation of plastics, etc. For example, there can be mentioned a phenolic antioxidant, an antioxidant of organic acid derivative, a sulfurous antioxidant, an amine antioxidant, an amine-aldehyde condensate antioxidant, an amine-ketone condensate antioxidant or the like. From the viewpoint of exerting of the effects of the present invention without any deterioration of resist functions, it is preferred to use a phenolic antioxidant or an antioxidant of organic acid derivative among the above antioxidants.

As specific preferred examples of the antioxidants that can be used in the present invention, there can be mentioned 2,6-di-t-butyl-4-methylphenol, 4-hydroxymethyl-2,6-di-t-butylphenol, 2,2'-methylenebis(4-methyl-6-t-butylphenol), butylhydroxyanisole, t-butylhydroquinone, 2,4,5-trihydroxybutyrophenone, nordihydroguaiaretic acid, propyl gallate, octyl gallate, lauryl gallate, isopropyl citrate and the like. Of these, 2,6-di-t-butyl-4-methylphenol, 4-hydroxymethyl-2,6-di-t-butylphenol, butylhydroxyanisole and t-butylhydroquinone are preferred, and 2,6-di-t-butyl-4-methylphenol and 4-hydroxymethyl-2,6-di-t-butylphenol are more preferred.

The content of antioxidant in the composition of the present invention, based on the total solid mass, is preferably 1 ppm or more, more preferably 5 ppm or more, still more preferably 10 ppm or more, further more preferably 50 ppm or more and further preferably 100 ppm or more. The content of 100 to 10,000 ppm is optimally preferred. Multiple antioxidants may be used as a mixture.

[7] Film Formation

The composition of the present invention is applied onto a substrate to thereby form a thin film. The thickness of the applied film is preferably in the range of 0.05 to 4.0 µm.

An antireflection film may be provided as an underlayer of the formed film. As the antireflection film, use can be made of not only an inorganic film of titanium, titanium oxide, titanium nitride, chromium oxide, carbon, amorphous silicon or the like but also an organic film composed of a light absorber and a polymer material. The former film in the stage of film formation requires equipment, such as a vacuum vapor deposition apparatus, a CVD apparatus or a sputtering apparatus. As the organic antireflection film, there can be mentioned, for example, one composed of a diphenylamine derivative/formaldehyde modified melamine resin condensate, an alkali-soluble resin and a light absorber as described in Jpn. Pat. Appln. KOKOKU Publication No. (hereinafter referred to as JP-B-) 7-69611; one consisting of a product of reaction between a maleic anhydride copolymer and a diamine light absorber as described in U.S. Pat. No. 5,294,680; one containing a resin binder and a methylolmelamine thermal crosslinking agent as described in JP-A-6-118631; an acrylic resin antireflection film simultaneously having a carboxylate group, an epoxy group and a light absorbing group in each molecule thereof as described in JP-A-6-118656; one composed of a methylolmelamine and a benzophenone light absorber as described in JP-A-8-87115; one obtained by adding a low-molecular light absorber to a polyvinyl alcohol resin as described in JP-A-8-179509; or the like.

Also, as the organic antireflection film, use can be made of commercially available organic antireflection films, such as DUV30 Series and DUV40 Series produced by Brewer Science Inc. and AR-2, AR-3 and AR-5 produced by Shipley Co., Ltd.

Further, according to necessity, an antireflection film can be provided as an upper layer on the resist.

Moreover, as the antireflection film, there can be mentioned, for example, AQUATAR-II, AQUATAR-III, AQUATAR-VII, etc. manufactured by AZ Electronic Materials Co., Ltd.

In the production of a precision integrated circuit element, etc., the process for forming a pattern on a resist film is carried out as follows. A positive resist composition according to the present invention is applied onto a substrate (for example, a silicon/silicon dioxide coated substrate, a glass substrate, an ITO substrate, a quartz/chromium oxide coated substrate or the like) so as to form a resist film. The resist film is irradiated with actinic rays or radiation, such as KrF excimer laser beams, electron beams or EUV rays, and heated, developed, rinsed and dried. Thus, a desirable resist pattern can be formed.

As the alkali developer employed in the development, use can be made of an aqueous solution (generally 0.1 to 20 mass %) of alkali, for example, an inorganic alkali such as sodium hydroxide, potassium hydroxide, sodium carbonate, sodium silicate, sodium metasilicate or aqueous ammonia, a primary amine such as ethylamine or n-propylamine, a secondary amine such as diethylamine or di-n-butylamine, a tertiary amine such as triethylamine or methyldiethylamine, an alcoholamine such as dimethylethanolamine or triethanolamine, a quaternary ammonium salt such as tetramethylammonium hydroxide, tetraethylammonium hydroxide or choline, or a cycloamine such as pyrrole or piperidine. Further, appropriate amounts of an alcohol, such as isopropyl alcohol, and a surfactant, such as a nonionic one, can be added to the above aqueous solution of alkali before the use thereof.

Of these developers, a quaternary ammonium salt is preferred, and tetramethylammonium hydroxide and choline are more preferred.

The pH value of the alkali developer is generally in the range of 10 to 15.

EXAMPLE

Now, the present invention will be described in greater detail with reference to Examples, which however in no way limit the subject matter of the present invention.

Synthetic Example 1

Synthesis of Polymer ((A-1)-1)

Ethylene glycol monoethyl ether acetate amounting to 600 g was placed in a 2-liter flask and flushed with nitrogen at a flow rate of 100 ml/min for 1 hr. Separately, 105.4 g of (0.65 mol) of 4-acetoxystyrene, 35.6 g (0.25 mol) of t-butyl methacrylate, 17.6 g (0.10 mol) of benzyl methacrylate and 2.30 g (0.01 mol) of polymerization initiator V601 (produced by Wako Pure Chemical Industries, Ltd.) were dissolved in 200 g of ethylene glycol monoethyl ether acetate. The thus obtained solution was flushed with nitrogen under the same conditions as mentioned above.

The 2-liter flask in which ethylene glycol monoethyl ether acetate was placed was heated until the internal temperature thereof was increased to 80° C. Further, 2.30 g (0.01 mol) of polymerization initiator V601 was added and agitated for 5 min. Thereafter, the above monomer mixture solution was dropped under agitation over a period of 6 hr. After the completion of the dropping, heating and agitation were carried on for 2 hr. The reaction mixture solution was allowed to cool to room temperature and was dropped into 3 liters of hexane to thereby effect a polymer precipitation. The precipitate was collected by filtration, and the solid was dissolved in 500 ml of acetone and once more dropped in 3 liters of hexane. The precipitate was collected by filtration, and the solid was dried in vacuum. Thus, 151 g of a 4-acetoxystyrene/t-butyl methacrylate/benzyl methacrylate copolymer was obtained.

Of the obtained polymer, 40.00 g was dissolved in 200 ml of tetrahydrofuran. 5 ml of a 2.38 mass % aqueous tetramethylammonium hydroxide solution was added to the solution, and agitated at room temperature for 1 hr. Distilled water was added thereto to thereby effect a polymer precipitation. The precipitate was washed with distilled water and dried in vacuum. The polymer was dissolved in 100 ml of ethyl acetate, and hexane was added to the solution to thereby a polymer precipitation. The precipitate was collected, and the obtained polymer was dried in vacuum into powder. Thus, 35.5 g of polymer ((A-1)-1) was obtained. With respect to the polymer, the mass average molecular weight by GPC was 14,000, and the molecular weight dispersity (Mw/Mn) was 1.50.

Resins of Table 1 having the structures shown hereinbefore were synthesized in the same manner as in the above Synthetic Example 1 except that the monomers used were changed. With respect to each of the resins, the compositional ratios, mass average molecular weight (Mw) and molecular weight dispersity (Mw/Mn) are indicated in Table 1. All the resins (A-1)-1 to (A-1)-10 have the structure (A-1) but vary in the compositional ratio, molecular weight and dispersity.

TABLE 1

| Resin | Composition ratio (mol %) | | | | | Mass ave. molecular weight (Mw) | Dispersity (Mw/Mn) |
|---|---|---|---|---|---|---|---|
|  | (I-a) | (I-b) | (II) | (III) | (Other) |  |  |
| (A-1)-1 | 65 | 0 | 25 | 10 | — | 14000 | 1.50 |
| (A-1)-2 | 65 | 0 | 25 | 10 | — | 20000 | 1.55 |
| (A-1)-3 | 50 | 0 | 40 | 10 | — | 20000 | 1.57 |
| (A-1)-4 | 65 | 0 | 25 | 10 | — | 30000 | 1.60 |
| (A-1)-5 | 60 | 0 | 30 | 10 | — | 25000 | 1.50 |
| (A-1)-6 | 65 | 0 | 25 | 10 | — | 25000 | 1.40 |
| (A-1)-7 | 70 | 0 | 20 | 10 | — | 30000 | 1.50 |
| (A-1)-8 | 70 | 0 | 20 | 10 | — | 25000 | 1.50 |
| (A-1)-9 | 70 | 0 | 20 | 10 | — | 20000 | 1.41 |
| (A-1)-10 | 75 | 0 | 15 | 10 | — | 25000 | 1.50 |
| (A-5) | 0 | 65 | 25 | 10 | — | 14000 | 1.58 |
| (A-9) | 55 | 10 | 25 | 10 | — | 14000 | 1.53 |
| (Z-1) | 65 | 0 | 15 | 0 | 20 | 15000 | 1.58 |
| (Z-2) | 60 | 0 | 20 | 0 | 20 | 15000 | 1.60 |

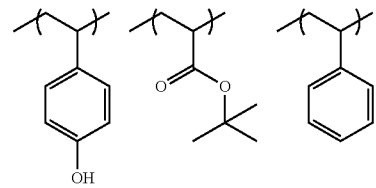

(Z-1)

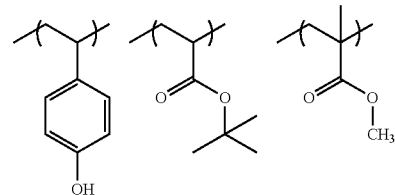

(Z-2)

[Preparation of Resist Composition]

Each indicated resin, acid generator, organic basic compound and surfactant were dissolved in either a solvent of propylene glycol monomethyl ether acetate (hereinafter simply referred to as PGMEA) or propylene glycol monomethyl ether (hereinafter simply referred to as PGME) or a mixture thereof to thereby obtain a solution of 10.0 mass % solid content. The obtained solution was subjected to precision filtration through a membrane filter of 0.1 μm pore diameter. Thus, intended resist solutions were obtained.

The evaluated resist solutions are summarized in Table 2. In the table, the addition amount (mass %) for each of the components other than solvent means the mass % based on the total solid excluding the solvent. With respect to each solvent, the mixing ratio (mass %) of PGMEA and PGME is indicated.

TABLE 2

| (A) Resin (mass %) | (B) Acid generator (mass %) | (C) Basic compound (mass %) | Surfactant (mass %) | Solvent | |
|---|---|---|---|---|---|
|  |  |  |  | PGMEA (mass %) | PGME (mass %) |
| Exam. 1 | (A-1)-2 (97.0) | B35 (2.5) | C-1(0.4) | D-1 (0.1) | 80 | 20 |
| Exam. 2 | (A-1)-2 (97.0) | B5 (2.5) | C-1(0.4) | D-1 (0.1) | 80 | 20 |
| Exam.3 | (A-1)-2 (97.0) | B48 (2.5) | C-1(0.4) | D-1 (0.1) | 80 | 20 |
| Exam. 4 | (A-1)-2 (97.0) | B23 (2.5) | C-1(0.4) | D-2 (0.1) | 80 | 20 |
| Exam. 5 | (A-1)-2 (97.0) | B10 (2.5) | C-3(0.4) | D-2 (0.1) | 80 | 20 |
| Exam. 6 | (A-1)-2 (97.5) | B9 (2.0) | C-3(0.4) | D-2 (0.1) | 80 | 20 |
| Exam. 7 | (A-1)-2 (95.5) | B35/B76 (2.0/2.0) | C-2(0.4) | D-1 (0.1) | 80 | 20 |
| Exam. 8 | (A-1)-2 (97.5) | B35/B5 (1.0/1.0) | C-1(0.4) | D-1 (0.1) | 80 | 20 |
| Exam. 9 | (A-1)-2/A-5 (87/10) | (B35) (2.5) | C-1(0.4) | D-1 (0.1) | 80 | 20 |
| Exam. 10 | A-9 (97.5) | B35 (2.0) | C-1(0.4) | D-1 (0.1) | 80 | 20 |
| Exam. 11 | A-9 (95.5) | B2 (4.0) | C-4(0.4) | (D1) (0.1) | 80 | 20 |
| Exam. 12 | (A-1)-1 (97.0) | B35 (2.5) | C-1(0.4) | D-1 (0.1) | 80 | 20 |
| Exam. 13 | (A-1)-3 (97.0) | B35 (2.5) | C-1(0.4) | D-1 (0.1) | 80 | 20 |
| Exam. 14 | (A-1)-4 (97.0) | B35 (2.5) | C-1(0.4) | D-1 (0.1) | 80 | 20 |
| Comp. 1 | Z-1 (97.0) | B35 (2.5) | C-1(0.4) | D-1 (0.1) | 80 | 20 |
| Comp. 2 | Z-2 (97.0) | B35 (2.5) | C-1(0.4) | D-1 (0.1) | 80 | 20 |

(Organic basic compound)
C-1: dicyclohexylmethylamine,
C-2: 2,4,6-triphenylimidazole,
C-3: tetra-(n-butyl) ammonium hydroxide, and
C-4:

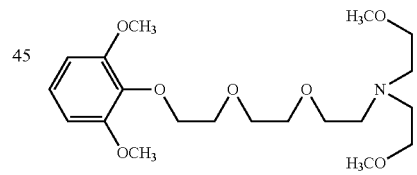

(Surfactant)
D-1: fluorinated surfactant Megafac F-176 (produced by Dainippon Ink & Chemicals, Inc.), and
D-2: fluorinated/siliconized surfactant Megafac R08 (produced by Dainippon Ink & Chemicals, Inc.)

[Pattern Formation and Evaluation 1 (KrF)]

Each of the above prepared positive resist solutions was uniformly applied onto a substrate coated with a 60 nm antireflection film (DUV42 produced by Brewer Science Inc.) by the use of a spin coater Mark 8, manufactured by Tokyo Electron Limited, and heated and dried at 130° C. for 60 sec, thereby obtaining a positive resist film of 0.4 μm average thickness. Pattern exposure of the resist film was carried out under NA=0.68 6=0.60 exposure conditions by the use of KrF excimer laser scanner (PAS5500/850C wavelength 248 nm, manufactured by ASML). The exposed resist was baked at 130° C. for 60 sec, immersed in a 2.38 mass % aqueous tetramethylammonium hydroxide (TMAH) solution for 60 sec, rinsed with water for 30 sec and dried. The thus obtained patterns were evaluated in the following methods. The results are summarized in Table 3.

(Line Width Roughness (LWR))

With respect to each obtained resist pattern, the line width was observed by the use of a scanning electron microscope (model S-8840, manufactured by Hitachi, Ltd.). Line width variation (LWR) was observed at an exposure intensity adequate for obtaining a 150 nm resist pattern with a mask pattern of 300 nm pitch and 150 nm mask size. The line width was measured at 32 points within a 1 μm range in the longitudinal direction of the pattern on a measurement monitor with the use of a critical dimension scanning electron microscope (SEM). The dispersal of variations (3σ) of detection locations was used as an index for LWR.

(Exposure Latitude (EL))

With respect to each resist pattern obtained in the same manner as mentioned above, the line width was observed by the use of scanning electron microscope (model S-9220, manufactured by Hitachi, Ltd.). The effective sensitivity was defined as the exposure intensity at which a 150 nm resist pattern was obtained with a mask pattern of 300 nm pitch and 150 nm mask size. The EL was defined as the quotient (percentage) of exposure intensity for 100% change of line width divided by effective exposure intensity.

(Profile)

The section configuration of the 150 nm width resist pattern was observed by the use of a cross-section SEM. A was judged when the side face approximately vertically sheerly extended to thereby attest to inhibition of standing wave effects. 2A was judged when among those of A, superiority was recognized. B was judged when, although a slight taper was observed, inhibition of standing wave effects was recognized. C was judged when the side face was undulant and standing wave effects were apparent.

(Defect)

At the above effective sensitivity, mask size 0.15 μm pattern exposure was carried out at 78 points within a wafer surface. On the thus obtained patterned wafer, the number of development defects was measured by the use of KLA-2360 manufactured by KLA-Tencor Corporation. In the measurement, the inspected area was a total of 205 cm², the pixel size 0.25 μm and the threshold 30, and visible light was used as the inspection light. Evaluation was made by the number of defects (count/cm²), namely, the quotient of the obtained count divided by the inspected area.

(Film Retention Ratio (Plasma Etching Resistance))

A 0.4 μm thick positive resist film was formed on a wafer having undergone hexamethyldisilazane treatment. Plasma etching thereof was carried out using a mixed gas consisting of $CF_4$ (10 ml/min), $O_2$ (20 ml/min) and Ar (1000 ml/min) at 23° C. for 30 sec. Thereafter, the retention amount of the resist film was measured. The film retention ratio (%) was defined as 100 times the quotient of the retention amount divided by the original film thickness 0.4 μm. The larger the film retention ratio, the higher the plasma etching resistance.

TABLE 3

(KrF excimer laser irradiation)

| | LWR (nm) | EL (%) | Number of defects (count/cm²) | Film retention ratio (%) | Profile |
|---|---|---|---|---|---|
| Exam. 1 | 9.5 | 21.0 | 0.5 | 95.0 | A |
| Exam. 2 | 9.0 | 19.0 | 1.0 | 94.0 | A |
| Exam. 3 | 8.0 | 17.0 | 1.0 | 95.4 | A |
| Exam. 4 | 8.5 | 18.5 | 0.5 | 94.7 | 2A |
| Exam. 5 | 8.7 | 18.0 | 0.5 | 94.6 | 2A |
| Exam. 6 | 8.6 | 18.5 | 0.5 | 95.3 | 2A |
| Exam. 7 | 9.7 | 17.5 | 0.5 | 94.5 | A |
| Exam. 8 | 8.6 | 19.5 | 0.5 | 96.3 | 2A |
| Exam. 9 | 8.0 | 19.0 | 1.2 | 95.0 | A |
| Exam. 10 | 8.0 | 19.5 | 1.0 | 96.3 | 2A |
| Exam. 11 | 8.5 | 17.0 | 1.0 | 96.2 | 2A |
| Exam. 12 | 10.0 | 18.0 | 1.0 | 93.5 | B |
| Exam. 13 | 13.0 | 17.0 | 5.0 | 97.0 | B |
| Exam. 14 | 10.5 | 22.0 | 11.0 | 96.5 | A |
| Comp. 1 | 13.0 | 16.0 | 10 | 95.0 | B |
| Comp. 2 | 13.2 | 14.0 | 1.5 | 89.5 | B |

[Pattern Formation and Evaluation 2 (EB)]

Each of the same resist solutions as employed in the Pattern formation and evaluation 1 (KrF) except with a solid content changed to 8 mass % was applied onto a silicon wafer having undergone hexamethyldisilazane treatment by the use of a spin coater Mark 8, manufactured by Tokyo Electron Limited, and baked at 120° C. for 60 sec, thereby obtaining a film of 0.3 μm average thickness.

Each of the obtained resist films was irradiated with electron beams by the use of an electron beam image-drawing apparatus (HL750 manufactured by Hitachi, Ltd., acceleration voltage 50 KeV). The irradiated resist film was baked at 130° C. for 60 sec, developed in a 2.38 mass % aqueous tetramethylammonium hydroxide (TMAH) solution for 60 sec, rinsed with water for 30 sec and dried. The thus obtained patterns were evaluated in the following manners. The results are summarized in Table 4.

(Resolving Power)

On the obtained pattern, the line width was observed by the use of a scanning electron microscope (model S-9260, manufactured by Hitachi, Ltd.). The sensitivity was defined as the irradiation energy at the time of resolution of 0.15 μm line (line:space=1:1). To what micron (μm) resolution could be made with respect to the pattern of line:space=1:1 by the irradiation energy realizing the above sensitivity was observed by the use of the above scanning electron microscope.

(Defect)

Electron beam irradiation was carried out by the above irradiation energy exhibiting the above sensitivity, and baking and development were carried out in the same manner as mentioned above, thereby effecting a patterning of line:space=1:1 and 0.15 μm line. At 100 points with an area of 3 μm length and 3 μm width, the number of development defects (count/cm²) was inspected by the use of the above scanning electron microscope.

(Film Retention Ratio (Plasma Etching Resistance))

Evaluation was made in the same manner as in the above evaluation 1.

TABLE 4

(electron beam irradiation)

|  | Film retention ratio (%) | Number of defects (count/cm²) | Resolving power (μm) |
|---|---|---|---|
| Exam. 1 | 95.0 | 1.0 | 0.13 |
| Exam. 2 | 93.0 | 1.0 | 0.08 |
| Exam. 3 | 93.0 | 2.0 | 0.07 |
| Exam. 4 | 95.5 | 0.5 | 0.11 |
| Exam. 5 | 95.5 | 0.5 | 0.12 |
| Exam. 6 | 95.5 | 0.5 | 0.11 |
| Exam. 7 | 96.0 | 2.0 | 0.09 |
| Exam. 8 | 96.0 | 0.5 | 0.11 |
| Exam. 9 | 96.0 | 2.0 | 0.08 |
| Exam. 10 | 95.0 | 2.0 | 0.08 |
| Exam. 11 | 95.5 | 2.0 | 0.08 |
| Exam. 12 | 92.0 | 2.5 | 0.08 |
| Exam. 13 | 96.5 | 1.0 | 0.11 |
| Exam. 14 | 97.0 | 6.0 | 0.10 |
| Comp. 1 | 95.2 | 8.0 | 0.10 |
| Comp. 2 | 89.5 | 2.5 | 0.09 |

[Pattern Formation and Evaluation 3 (EUV)]

Each of the same resist solutions as employed in the Pattern formation and evaluation (KrF 1) except with a solid content changed to 6 mass % was applied onto a silicon wafer having undergone hexamethyldisilazane treatment by the use of a spin coater Mark 8, manufactured by Tokyo Electron Limited, and baked at 120° C. for 60 sec, thereby obtaining a film of 0.15 μm average thickness.

Each of the obtained resist films was exposed to EUV rays (13 nm wavelength, EUVES manufactured by Litho Tech Japan Co., Ltd.) while changing the exposure intensity by 0.5 mJ at a time within the range of 0 to 20.0 mJ, and baked at 130° C. for 60 sec. Thereafter, using a 2.38 mass % aqueous tetramethylammonium hydroxide (TMAH) solution, the dissolution rate at each of the exposure intensities was measured, thereby obtaining a sensitivity curve.

(Resolving Power (Dissolution Contrast))

The sensitivity was defined as the exposure intensity at which the dissolution rate of the resist was saturated on the sensitivity curve. Dissolution contrast (γ value) as an index for resolving power was calculated from the gradient of the straight line portion of the sensitivity curve. The larger the γ value, the greater the excellence in dissolution contrast, namely, the higher the resolving power.

(Development Defect)

Exposure was carried out by the above exposure intensity exhibiting the above sensitivity, and baking and development were carried out in the same manner as mentioned above. At 100 points with an area of 3 μm length and 3 μm width at the border of the exposed part and unexposed part, the number of development defects (count/cm²) was inspected by the use of the above scanning electron microscope.

(Film Retention Ratio (Plasma Etching Resistance))

Evaluation was made in the same manner as in the above evaluation 1.

TABLE 5

(EUV ray irradiation)

|  | Film retention ratio (%) | Number of defects (count/cm²) | Resolving power -γ value- |
|---|---|---|---|
| Exam. 1 | 96.5 | 0.5 | 6.3 |
| Exam. 2 | 93.0 | 1.0 | 5.5 |
| Exam. 3 | 93.0 | 1.0 | 6.0 |
| Exam. 4 | 95.5 | 0.5 | 6.5 |
| Exam. 5 | 95.5 | 0.5 | 6.2 |
| Exam. 6 | 95.5 | 0.5 | 6.5 |
| Exam. 7 | 96.0 | 1.0 | 6.3 |
| Exam. 8 | 96.0 | 1.0 | 6.3 |
| Exam. 9 | 96.0 | 1.0 | 6.2 |
| Exam. 10 | 95.0 | 1.0 | 6.0 |
| Exam. 11 | 95.5 | 1.0 | 6.0 |
| Exam. 12 | 95.0 | 1.5 | 6.0 |
| Exam. 13 | 96.5 | 10.0 | 5.5 |
| Exam. 14 | 97.0 | 11.0 | 5.7 |
| Comp. 1 | 96.5 | 11.0 | 6.5 |
| Comp. 2 | 89.5 | 6.5 | 4.5 |

From the results of Table 3, Table 4 and Table 5, it is apparent that the resist composition of the present invention can provide a pattern simultaneously satisfying LWR, EL and defect performances and excellent pattern configuration.

[Pattern Formation and Evaluation 4 (Thick Film KrF)]

[Preparation of Resist Composition]

Each indicated resin, acid generator, organic basic compound and surfactant were dissolved in a solvent of at least one member selected from among propylene glycol monomethyl ether acetate (hereinafter simply referred to as PGMEA), propylene glycol monomethyl ether (hereinafter simply referred to as PGME), ethyl lactate (hereinafter simply referred to as EL), methyl lactate (hereinafter simply referred to as MLc), butyl lactate (hereinafter simply referred to as BLc), methyl 3-methoxypropionate (hereinafter simply referred to as MMP), methyl amyl ketone (hereinafter simply referred to as MAK), cyclohexanone (hereinafter simply referred to as CHA), ethyl 3-ethoxypropionate (hereinafter simply referred to as EEP), ethyl pyruvate (hereinafter simply referred to as EP), ethylene glycol monomethyl ether acetate (hereinafter simply referred to as MCA) and ethylene glycol monoethyl ether (hereinafter simply referred to as EGME) to thereby obtain a solution of 22.0 mass % solid content. The obtained solution was subjected to precision filtration through a membrane filter of 0.1 μm pore diameter. Thus, intended resist solutions were obtained.

The evaluated resist solutions are summarized in Table 6. In the table, the addition amount (mass %) for each of the components other than the solvent means the mass % based on the total solid excluding the solvent. The mixing ratio (mass %) is indicated with respect to each solvent.

TABLE 6

|  | (A)Resin (mass %) | (B)Acid generator (mass %) | (C)Basic compound (mass %) | Surfactant (mass %) | Solvent A (mass %) | Solvent B (mass %) |
|---|---|---|---|---|---|---|
| Exam. 15 | (A-1)-3 (97.0) | B23 (2.5) | C-1 (0.4) | D-1 (0.1) | PGMEA (80) | PGME (20) |

TABLE 6-continued

| | (A)Resin (mass %) | (B)Acid generator (mass %) | (C)Basic compound (mass %) | Surfactant (mass %) | Solvent A (mass %) | Solvent B (mass %) |
|---|---|---|---|---|---|---|
| Exam. 16 | (A-1)-5 (97.0) | B23 (2.5) | C-3 (0.4) | D-1 (0.1) | PGMEA (80) | PGME (20) |
| Exam. 17 | (A-1)-8 (97.0) | B23 (2.5) | C-1 (0.4) | D-2 (0.1) | PGMEA (80) | PGME (20) |
| Exam. 18 | (A-1)-10 (97.0) | B23 (2.5) | C-1 (0.4) | D-1 (0.1) | PGMEA (80) | PGME (20) |
| Exam. 19 | (A-1)-8 (97.0) | B23 (2.5) | C-1 (0.4) | D-1 (0.1) | PGMEA (80) | EL (20) |
| Exam. 20 | (A-1)-8 (97.0) | B23 (2.5) | C-1 (0.4) | D-1 (0.1) | PGMEA (80) | MCA (20) |
| Exam. 21 | (A-1)-8 (97.0) | B23 (2.5) | C-1 (0.4) | D-1 (0.1) | PGMEA (80) | EP (20) |
| Exam. 22 | (A-1)-8 (97.0) | B23 (2.5) | C-1 (0.4) | D-1 (0.1) | PGMEA (80) | MMP (20) |
| Exam. 23 | (A-1)-8 (97.0) | B23 (2.5) | C-1 (0.4) | D-1 (0.1) | PGMEA (100) | — |
| Exam. 24 | (A-1)-8 (97.0) | B23 (2.5) | C-1 (0.4) | D-1 (0.1) | PGME (100) | — |
| Exam. 25 | (A-1)-8 (97.0) | B23 (2.5) | C-1 (0.4) | D-2 (0.1) | EL (100) | — |
| Exam. 26 | (A-1)-6 (97.0) | B23 (2.5) | C-3 (0.4) | D-1 (0.1) | BLc (100) | — |
| Exam. 27 | (A-1)-8 (97.0) | B23 (2.5) | C-1 (0.4) | D-1 (0.1) | MLc (100) | — |
| Exam. 28 | (A-1)-7 (97.0) | B23 (2.5) | C-1 (0.4) | D-1 (0.1) | MMP (100) | — |
| Exam. 29 | (A-1)-8 (97.0) | B23 (2.5) | C-1 (0.4) | D-1 (0.1) | MAK (100) | — |
| Exam. 30 | (A-1)-9 (97.0) | B23 (2.5) | C-3 (0.4) | D-2 (0.1) | CHA (100) | — |
| Exam. 31 | (A-1)-8 (97.0) | B23 (2.5) | C-1 (0.4) | D-1 (0.1) | EEP (100) | — |
| Exam. 32 | (A-1)-8 (97.0) | B23 (2.5) | C-1 (0.4) | D-1 (0.1) | EP (100) | — |
| Exam. 33 | (A-1)-8 (97.0) | B23 (2.5) | C-1 (0.4) | D-1 (0.1) | MCA (100) | — |
| Exam. 34 | (A-1)-8 (97.0) | B23 (2.5) | C-1 (0.4) | D-1 (0.1) | EGME (100) | — |
| Exam. 35 | (A-1)-8 (97.0) | B35 (2.5) | C-1 (0.4) | D-1 (0.1) | PGMEA (100) | — |
| Exam. 36 | (A-1)-8 (97.0) | B5 (2.5) | C-3 (0.4) | D-1 (0.1) | PGMEA (100) | — |
| Exam. 37 | (A-1)-8 (97.0) | B48 (2.5) | C-1 (0.4) | D-2 (0.1) | PGMEA (100) | — |
| Exam. 38 | (A-1)-8 (97.0) | B10 (2.5) | C-1 (0.4) | D-1 (0.1) | PGMEA (100) | — |
| Exam. 39 | (A-1)-8 (97.0) | B2 (2.5) | C-1 (0.4) | D-1 (0.1) | PGMEA (100) | — |
| Exam. 40 | (A-1)-8 (97.0) | B9 (2.5) | C-1 (0.4) | D-1 (0.1) | PGMEA (100) | — |
| Exam. 41 | (A-1)-8 (97.0) | B64 (2.5) | C-1 (0.4) | D-1 (0.1) | PGMEA (100) | — |
| Exam. 42 | (A-1)-8 (97.0) | B65 (2.5) | C-1 (0.4) | D-2 (0.1) | PGMEA (100) | — |
| Exam. 43 | (A-1)-8 (96.5) | B9/B75 (1.0/2.0) | C-1 (0.4) | D-1 (0.1) | PGMEA (100) | — |
| Exam. 44 | (A-1)-8 (96.5) | B9/B76 (1.0/2.0) | C-1 (0.4) | D-1 (0.1) | PGMEA (100) | — |
| Exam. 45 | (A-1)-8 (96.5) | B9/B77 (1.0/2.0) | C-3 (0.4) | D-1 (0.1) | PGMEA (100) | — |
| Exam. 46 | (A-1)-8 (96.5) | B9/B78 (1.0/2.0) | C-1 (0.4) | D-1 (0.1) | PGMEA (100) | — |
| Comp. 3 | Z-1 (97.0) | B35 (2.5) | C-1 (0.4) | D-1 (0.1) | PGMEA (100) | — |
| Comp. 4 | Z-2 (97.0) | B35 (2.5) | C-1 (0.4) | D-1 (0.1) | PGMEA (100) | — |

Each of the above prepared positive resist solutions was uniformly applied onto a silicon wafer coated with a 60 nm antireflection film (DUV42 produced by Brewer Science Inc.) by the use of a spin coater Mark 8, manufactured by Tokyo Electron Limited, and baked at 120° C. for 60 sec, thereby obtaining a film of 2.0 μm average thickness.

Pattern exposure of the resist film was carried out under NA=0.68 6=0.60 exposure conditions by the use of a KrF excimer laser scanner (PAS5500/850C wavelength 248 nm, manufactured by ASML). The exposed resist was baked at 130° C. for 60 sec, immersed in a 2.38 mass % aqueous tetramethylammonium hydroxide (TMAH) solution for 60 sec, rinsed with water for 30 sec and dried. The thus obtained patterns were evaluated in the following manners. The results are summarized in Table 7.

(Depth of Focus (DOF))

The exposure intensity at which a 150 nm resist pattern could be obtained with a mask pattern of 300 nm pitch and 150 nm mask size under focus=0.0 μm condition was confirmed. DOF (μm) was defined as the range of focus wherein when using this exposure intensity, the focus was varied from −0.5 μm to 0.5 μm, and the size of the resist pattern fell within 162 to 198 nm.

(Exposure Latitude (EL))

With respect to each resist pattern obtained in the same manner as mentioned above, the line width was observed by the use of a scanning electron microscope (model S-9220, manufactured by Hitachi, Ltd.). The effective sensitivity was defined as the exposure intensity at which a 150 nm resist pattern was obtained with a mask pattern of 300 nm pitch and 150 nm mask size. The EL was defined as the quotient (percentage) of exposure intensity for a 100% change of line width divided by the effective exposure intensity.

(Profile)

The section configuration of 150 nm width resist pattern was observed by the use of a cross-section SEM. A was judged when the side face approximately vertically sheerly extended to thereby attest to inhibition of standing wave effects. 2A was judged when among those of A, superiority was recognized. B was judged when although a slight taper was observed, inhibition of standing wave effects was recognized. C was judged when the side face was tapering, became T-TOP, or was otherwise malformed.

TABLE V

| | DOF (μm) | EL (%) | Profile |
|---|---|---|---|
| Exam. 15 | 0.30 | 19.5 | B |
| Exam. 16 | 0.30 | 19.0 | B |
| Exam. 17 | 0.40 | 20.0 | B |
| Exam. 18 | 0.4 | 15.0 | B |
| Exam. 19 | 0.4 | 20.0 | A |
| Exam. 20 | 0.4 | 20.5 | A |
| Exam. 21 | 0.4 | 20.5 | A |
| Exam. 22 | 0.4 | 20.5 | A |
| Exam. 23 | 0.5 | 21.0 | 2A |
| Exam. 24 | 0.20 | 18.0 | A |
| Exam. 25 | 0.40 | 21.0 | A |
| Exam. 26 | 0.30 | 21.0 | A |
| Exam. 27 | 0.35 | 21.0 | A |
| Exam. 28 | 0.35 | 19.5 | A |
| Exam. 29 | 0.30 | 19.0 | A |
| Exam. 30 | 0.20 | 17.5 | B |
| Exam. 31 | 0.30 | 18.0 | B |
| Exam. 32 | 0.30 | 18.0 | B |
| Exam. 33 | 0.45 | 20.0 | A |
| Exam. 34 | 0.20 | 16.5 | B |
| Exam. 35 | 0.30 | 17.5 | B |
| Exam. 36 | 0.30 | 18.0 | B |
| Exam. 37 | 0.35 | 18.5 | B |
| Exam. 38 | 0.35 | 19.5 | A |
| Exam. 39 | 0.50 | 21.0 | 2A |
| Exam. 40 | 0.35 | 20.0 | A |
| Exam. 41 | 0.30 | 18.0 | B |
| Exam. 42 | 0.35 | 18.5 | B |
| Exam. 43 | 0.50 | 19.5 | A |
| Exam. 44 | 0.50 | 21.0 | A |
| Exam. 45 | 0.45 | 22.0 | A |
| Exam. 46 | 0.50 | 20.0 | A |
| Comp. 3 | 0.20 | 15.5 | C |
| Comp. 4 | 0.20 | 14.0 | C |

From the results of Table 7, it is apparent that the resist composition of the present invention can provide a thick-film pattern simultaneously satisfying DOF, EL and excellent pattern configuration.

What is claimed is:

1. An actinic ray-sensitive or radiation-sensitive resin composition comprising:

(A) a resin containing the repeating units of formulae (I), (II) and (III) that when acted on by an acid, becomes soluble in an alkali developer, and (B) a compound that when irradiated with actinic rays or radiation, generates a fluorine-containing acid,

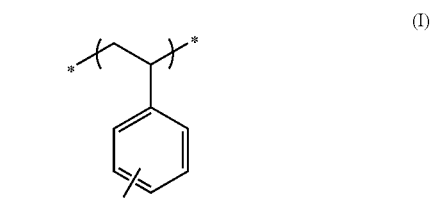

(I)

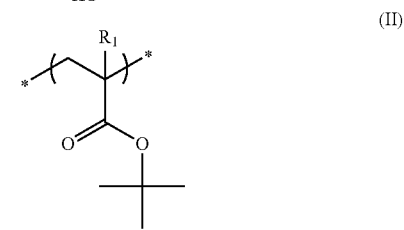

(II)

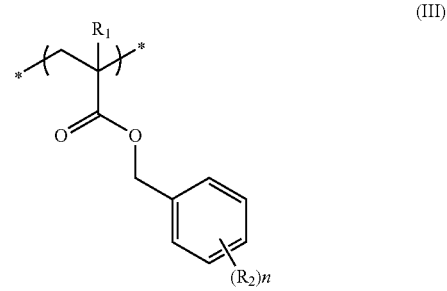

(III)

in the formula (II), $R_1$ represents a hydrogen atom or an optionally substituted methyl group, and in the formula (III), $R_1$ represents a hydrogen atom or an optionally substituted methyl group, $R_2$ represents a halogen atom, an optionally substituted alkyl group, an optionally substituted cycloalkyl group, an optionally substituted aryl group or an optionally substituted aralkyl group, n is an integer of 0 to 5, provided that when n is 2 or greater, multiple $R_2$s may be identical to or different from each other, and wherein at least one member selected from among the compounds of formulae (B-a) and (B-b) is contained as the acid generator constituting the component (B),

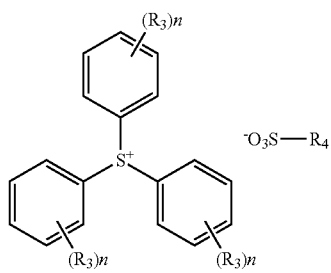
(B-a)

wherein each of R₃s independently represents a hydrogen atom, an optionally substituted alkyl group an optionally substituted aryl group, an optionally substituted alkoxy group or an optionally substituted cycloalkyl group, R₄ represents a phenyl group substituted with at least a fluorine atom and/or a fluoroalkyl group, and n is an integer of 0 to 5,

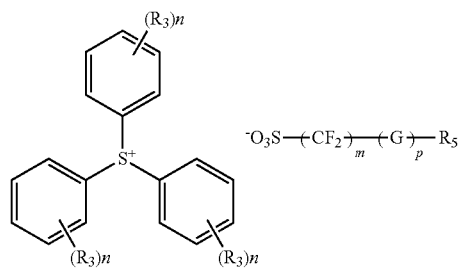
(B-b)

wherein each of R₃s independently represents a hydrogen atom, an optionally substituted alkyl group, an optionally substituted aryl group, an optionally substituted alkoxy group or an optionally substituted cycloalkyl group, G represents a linkage group, R₅ represents an organic group containing a heterocyclic group; or an optionally substituted aryl group, or an optionally substituted cycloalkyl group, m is an integer of 2 or greater, p is an integer of 0 or greater, and n is an integer of 0 to 5, provided that when p is 2 or greater, multiple Gs may be identical to or different from each other.

2. The actinic ray-sensitive or radiation sensitive resin composition according to claim 1, wherein the resin as component (A) contains at least either the structure of formula (I-a) or the structure of formula (I-b) as the repeating unit of formula (I):

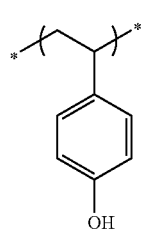
(I-a)

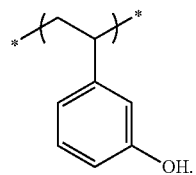
(I-b)

3. The actinic ray-sensitive or radiation-sensitive resin composition according to claim 1, wherein the resin as component (A) contains the structure of formula (I-a) and the structure of formula (I-b) as the repeating unit of formula (I):

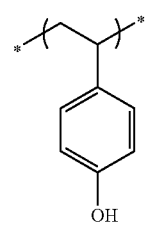
(I-a)

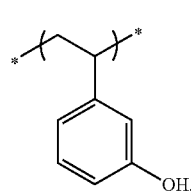
(I-b)

4. The actinic ray-sensitive or radiation-sensitive resin composition according to claim 1, wherein the resin as component (A) has a mass average molecular weight of 15,000 to 25,000.

5. The actinic ray-sensitive or radiation-sensitive resin composition according to claim 1, wherein the content ratios of repeating units of formulae (I) to (III) based on all the repeating units contained in the resin as component (A) are in the range of 55 to 75 mol %, 15 to 35 mol % and 5 to 20 mol %, respectively.

6. The actinic ray-sensitive or radiation-sensitive resin composition according to claim 1, wherein the content of total solids of the composition is in the range of 2 to 30 mass %.

7. A method of forming a pattern, comprising the steps of shaping the actinic ray-sensitive or radiation-sensitive resin composition according to claim 1 into a film and subjecting the film to exposure to light and development.

8. The composition according to claim 1, wherein the component (B) is a compound represented by the formula (B-b).

9. The composition according to claim 1, wherein the component (B) is a compound represented by the formula (B-a), and R₄ in the formula is a phenyl group substituted with at least a fluoroalkyl group.

* * * * *